(12) United States Patent     (10) Patent No.:   US 12,688,998 B2

Fujimura et al.     (45) Date of Patent:   ***Jul. 21, 2026

(54) METHOD AND SYSTEM FOR DETERMINING A CHARGED PARTICLE BEAM EXPOSURE FOR A LOCAL PATTERN DENSITY

(71) Applicant: D2S, Inc., San Jose, CA (US)

(72) Inventors: Akira Fujimura, Saratoga, CA (US); Harold Robert Zable, Palo Alto, CA (US); Nagesh Shirali, San Jose, CA (US); Abhishek Shendre, Fremont, CA (US); William E. Guthrie, Santa Clara, CA (US); Ryan Pearman, San Jose, CA (US)

(73) Assignee: D2S, Inc., San Jose, CA (US)

( * ) Notice: Subject to any disclaimer, the term of this patent is extended or adjusted under 35 U.S.C. 154(b) by 802 days.

This patent is subject to a terminal disclaimer.

(21) Appl. No.: 18/068,293

(22) Filed: Dec. 19, 2022

(65) Prior Publication Data

US 2023/0124768 A1    Apr. 20, 2023

Related U.S. Application Data

(63) Continuation-in-part of application No. 17/304,307, filed on Jun. 17, 2021, now Pat. No. 11,756,765.

(Continued)

(51) Int. Cl.
*H01J 37/302*     (2006.01)
*G03F 1/36*     (2012.01)
(Continued)

(52) U.S. Cl.
CPC ............ *H01J 37/3026* (2013.01); *G03F 1/36* (2013.01); *G03F 1/70* (2013.01); *G03F 7/2061* (2013.01);
(Continued)

(58) Field of Classification Search
CPC .............. H01J 37/3026; H01J 37/3177; H01J 2237/31761; H01J 2237/31771;
(Continued)

(56) References Cited

U.S. PATENT DOCUMENTS

| | | | |
|---|---|---|---|
| 4,463,265 A | 7/1984 | Owen et al. | |
| 5,451,487 A | 9/1995 | Abe et al. | |

(Continued)

FOREIGN PATENT DOCUMENTS

| | | |
|---|---|---|
| CN | 1530755 A | 9/2004 |
| CN | 103488042 A | 1/2014 |

(Continued)

OTHER PUBLICATIONS

Notice of Allowance dated Feb. 11, 2025 for Korean Patent Application No. 10-2021-7038241.

(Continued)

*Primary Examiner* — Nha T Nguyen

(74) *Attorney, Agent, or Firm* — MLO, a professional corp.

(57) ABSTRACT

Methods for exposing a desired shape in an area on a surface using a charged particle beam system include determining a local pattern density for the area, based on an original set of exposure information. A pre-proximity effect correction (PEC) maximum dose for the local pattern density is determined, based on a pre-determined target post-PEC maximum dose. The pre-PEC maximum dose is calculated near an edge of the desired shape. Methods also include modifying the original set of exposure information with the pre-PEC maximum dose to create a modified set of exposure information.

19 Claims, 20 Drawing Sheets

Related U.S. Application Data which is a continuation-in-part of application No. 16/934,281, filed on Jul. 21, 2020, now Pat. No. 11,062,878, which is a continuation of application No. 16/422,269, filed on May 24, 2019, now Pat. No. 10,748,744.

(51) Int. Cl.

| | | |
|---|---|---|
| *G03F 1/70* | (2012.01) | |
| *G03F 7/20* | (2006.01) | |
| *H01J 37/317* | (2006.01) | |

(52) U.S. Cl.

CPC . *H01J 37/3177* (2013.01); *H01J 2237/31761* (2013.01); *H01J 2237/31771* (2013.01); *H01J 2237/31774* (2013.01); *H01J 2237/31776* (2013.01)

(58) Field of Classification Search

CPC ... H01J 2237/31774; H01J 2237/31776; H01J 2237/31769; H01J 37/3174; G03F 1/36; G03F 1/70; G03F 7/2061; G03F 1/78

See application file for complete search history.

(56) References Cited

U.S. PATENT DOCUMENTS

| | | | |
|---|---|---|---|
| 5,510,214 | A | 4/1996 | Pan et al. |
| 5,582,938 | A | 12/1996 | Ham |
| 5,847,959 | A | 12/1998 | Veneklasen et al. |
| 5,885,748 | A | 3/1999 | Ohnuma |
| 6,528,806 | B1 | 3/2003 | Kawamura |
| 6,872,507 | B2 | 3/2005 | Tzu et al. |
| 7,241,542 | B2 | 7/2007 | Hudek et al. |
| 8,062,813 | B2 | 11/2011 | Zable et al. |
| 8,137,871 | B2 | 3/2012 | Zable et al. |
| 8,221,939 | B2 | 7/2012 | Zable et al. |
| 8,221,940 | B2 | 7/2012 | Zable et al. |
| 9,038,003 | B2 | 5/2015 | Pearman et al. |
| 9,043,734 | B2 | 5/2015 | Fujimura et al. |
| 9,057,956 | B2 | 6/2015 | Fujimura et al. |
| 9,343,267 | B2 | 5/2016 | Fujimura et al. |
| 9,612,530 | B2 | 4/2017 | Fujimura et al. |
| 9,625,809 | B2 | 4/2017 | Fujimura et al. |
| 9,990,708 | B2 * | 6/2018 | Toyoda ................. G01N 23/225 |
| 10,478,744 | B2 | 11/2019 | Meyer et al. |
| 10,522,329 | B2 | 12/2019 | Platzgummer et al. |
| 10,748,744 | B1 | 8/2020 | Fujimura et al. |
| 11,062,878 | B2 | 7/2021 | Fujimura et al. |
| 11,756,765 | B2 | 9/2023 | Fujimura et al. |
| 12,457,630 | B2 * | 10/2025 | Gupta ................... H02J 50/001 |
| 2002/0148978 | A1 | 10/2002 | Innes et al. |
| 2003/0124442 | A1 | 7/2003 | Yang |
| 2004/0011966 | A1 | 1/2004 | Sasaki et al. |
| 2004/0178366 | A1 | 9/2004 | Ando et al. |
| 2006/0183025 | A1 | 8/2006 | Yang et al. |
| 2007/0196768 | A1 * | 8/2007 | Ogino .................... B82Y 40/00 |
| | | | 430/296 |
| 2008/0168419 | A1 | 7/2008 | Burkhardt et al. |
| 2008/0203324 | A1 | 8/2008 | Fujimura et al. |
| 2009/0181551 | A1 | 7/2009 | Tan et al. |
| 2010/0055586 | A1 | 3/2010 | Fujimura et al. |
| 2012/0094219 | A1 | 4/2012 | Fujimura et al. |
| 2012/0219886 | A1 | 8/2012 | Fujimura et al. |
| 2012/0221981 | A1 | 8/2012 | Fujimura et al. |
| 2013/0205264 | A1 | 8/2013 | Fujimura et al. |
| 2013/0283216 | A1 | 10/2013 | Pearman et al. |
| 2013/0288181 | A1 | 10/2013 | Sugiyama |
| 2013/0309610 | A1 | 11/2013 | Zable et al. |
| 2014/0007023 | A1 | 1/2014 | Shin et al. |
| 2014/0138527 | A1 | 5/2014 | Kato et al. |
| 2014/0346369 | A1 * | 11/2014 | Matsumoto ......... H01J 37/3177 |
| | | | 250/398 |
| 2016/0195805 | A1 | 7/2016 | Fujimura et al. |

| | | | |
|---|---|---|---|
| 2016/0252807 | A1 | 9/2016 | Manakli et al. |
| 2016/0276132 | A1 | 9/2016 | Platzgummer et al. |
| 2016/0349626 | A1 | 12/2016 | Matsumoto |
| 2017/0124247 | A1 | 5/2017 | Fujimura et al. |
| 2017/0139327 | A1 | 5/2017 | Nomura |
| 2017/0278672 | A1 | 9/2017 | Suganuma et al. |
| 2019/0066975 | A1 * | 2/2019 | Matsumoto ............. H01J 37/24 |
| 2019/0066976 | A1 * | 2/2019 | Platzgummer ...... H01J 37/3026 |
| 2019/0304748 | A1 | 10/2019 | Yoshikawa et al. |
| 2019/0304749 | A1 * | 10/2019 | Yoshikawa ......... H01J 37/3026 |
| 2020/0096876 | A1 * | 3/2020 | Lin ..................... H01J 37/3026 |
| 2020/0098545 | A1 | 3/2020 | Chang et al. |

FOREIGN PATENT DOCUMENTS

| | | |
|---|---|---|
| CN | 103858211 A | 6/2014 |
| EP | 1429368 A2 | 6/2004 |
| EP | 3264442 A1 | 1/2018 |
| JP | H07297094 A | 11/1995 |
| JP | H08321462 A | 12/1996 |
| JP | H10055958 A | 2/1998 |
| JP | 2003338460 A | 11/2003 |
| JP | 2005019426 A | 1/2005 |
| JP | 2006032480 A | 2/2006 |
| JP | 2012527765 | 11/2012 |
| JP | 2013115226 A | 6/2013 |
| JP | 2013219288 A | 10/2013 |
| JP | 2013229512 A | 11/2013 |
| JP | 2010098275 A | 3/2014 |
| JP | 2014512670 A | 5/2014 |
| JP | 2014530494 A | 11/2014 |
| JP | 2015005729 A | 1/2015 |
| JP | 2016174152 A | 9/2016 |
| JP | 2017092467 A | 5/2017 |
| JP | 2018006748 A | 1/2018 |
| JP | 2018107179 A | 7/2018 |
| JP | 7474787 B2 | 4/2024 |
| KR | 1020150142900 A | 12/2015 |
| TW | 201142904 A | 12/2011 |
| TW | 201717244 B | 5/2017 |

OTHER PUBLICATIONS

Office Action dated Dec. 24, 2024 for Japan Patent Application No. 2024-065404.

Office Action dated Feb. 24, 2025 for Republic of Korea Patent Application No. 10-2021-7019507.

Office Action dated Jan. 28, 2025 for Japan Patent Application No. 2021-535205.

Office Action dated Jul. 31, 2024 for U.S. Appl. No. 18/365,146.

Notice of Allowance and Fees dated Sep. 26, 2023 for U.S. Appl. No. 18/168,772.

Office Action dated Nov. 21, 2023 for Japan Patent Application No. 2021-535205.

Official Letter and Search Report dated Sep. 28, 2023 for Taiwan Patent Application No. 109116592.

Office Action dated Sep. 17, 2024 for Japan Patent Application No. 2021-535205.

Notice of Allowance and Fees dated Jul. 7, 2023 for U.S. Appl. No. 17/304,307.

Office Action dated Jun. 20, 2023 for U.S. Appl. No. 18/168,772.

Geraint Owen et al., "Proximity effect correction for electron beam lithography by equalization of background dose," Journal of Applied Physics, vol. 54, Issue 6, Jun. 1983.

International Search Report dated Apr. 13, 2020 for PCT Patent Application No. PCT/IB2019/060968.

International Search Report dated Aug. 18, 2020 for PCT Patent Application No. PCT/IB2020/054546.

Klimpel, T. et al., "Proximity effect correction optimizing image quality and writing time for an electron multi-beam mask writer," Proc. SPIE vol. 8522, Nov. 8, 2012.

Mack, Chris A. et al., "Electron-beam lithography simulation for maskmaking, part V: Impact of GHOST proximity effect correction on process window", SPIE vol. 3873, pp. 2-20, Dec. 30, 1999.

(56)     References Cited

OTHER PUBLICATIONS

Notice of Allowance dated Apr. 22, 2020 for U.S. Appl. No. 16/422,269.

Notice of Allowance dated Mar. 15, 2021 for U.S. Appl. No. 16/934,281.

Notice of Allowance dated Sep. 1, 2020 for U.S. Appl. No. 16/231,447.

Office Action dated Dec. 8, 2020 for U.S. Appl. No. 16/934,281.

Office Action dated May 29, 2020 for U.S. Appl. No. 16/231,447.

Office Action dated Nov. 10, 2021 for Austria Patent Application No. A9484/2019.

Office Action dated Nov. 24, 2021 for U.S. Appl. No. 17/135,400.

Office Action dated Apr. 16, 2024 for Japan Patent Application No. 2021-535205.

Office Action dated Mar. 1, 2023 for U.S. Appl. No. 17/304,307.

Official Letter and Search Report dated Aug. 21, 2023 for Taiwan Patent Application No. 108146715.

Office Action dated Aug. 18, 2025 for Republic of Korea Patent Application No. 10-2021-7019507.

Office Action dated Oct. 21, 2025 for Japan Patent Application No. 2024-211143.

Office Action dated Nov. 26, 2025 for Republic of Korea Patent Application No. 10-2025-7013161.

Office Action dated Feb. 10, 2026 for Japan Patent Application No. 2024-211143.

Notice of Allowance dated Mar. 30, 2026 for Republic of Korea Patent Application No. 10-2025-7013161.

* cited by examiner

CHARGED PARTICLE BEAMLET

CHARGED PARTICLE BEAMLET

CHARGED PARTICLE BEAMLET

210

210

210

BEAM CONTROLLER

BEAM CONTROLLER

BEAM CONTROLLER

220

220

220

SURFACE

230

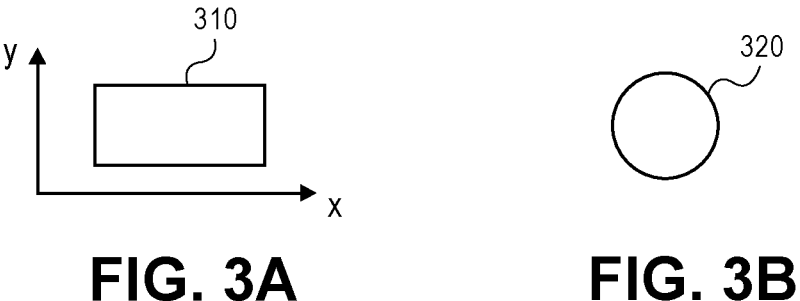
FIG. 3A          FIG. 3B
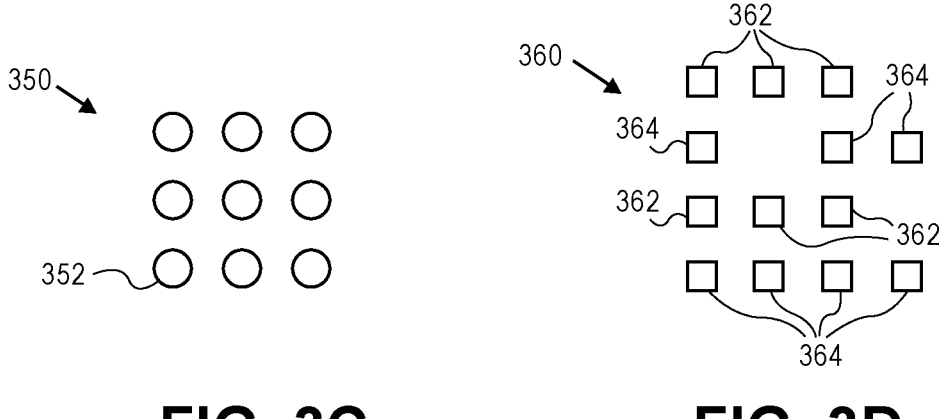
FIG. 3C          FIG. 3D
(PRIOR ART)

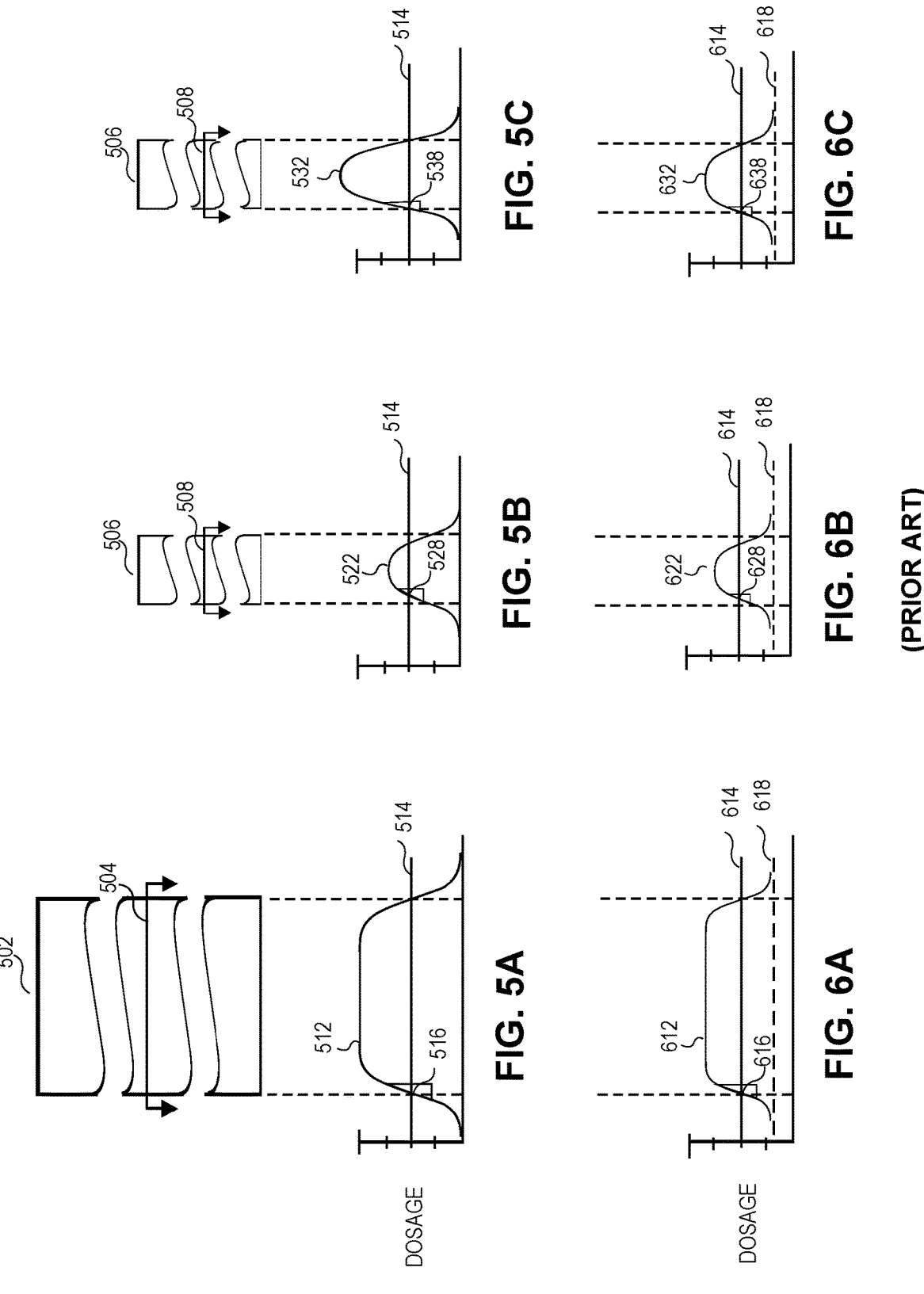

810                    815 dose 1.0

810                    815 dose ~1.0

830     832     834 dose 1.0

830     832     834 dose = 0.5

1600

1700

1706 — Original Set of Exposure Information

1708 — Post-PEC Maximum Dose

1710 — Calculate Local Pattern Density and/or Backscatter

1712 — Calculate Pre-PEC Max Dose

1714 — Increase Pixel Dose in Sub Areas

1716 — Modified Exposure Information

1900

| 1.3 | 1.2 | 1.0 | 0.2 | 0.0 | 0.0 | 0.0 | 0.0 | 0.3 |
|-----|-----|-----|-----|-----|-----|-----|-----|-----|
| 1.2 | 1.2 | 1.0 | 0.2 | 0.0 | 0.0 | 0.0 | 0.0 | 0.3 |
| 1.0 | 1.0 | 1.2 | 0.2 | 0.0 | 0.0 | 0.0 | 0.0 | 0.3 |
| 0.2 | 0.2 | 0.2 | 0.2 | 0.0 | 0.0 | 0.0 | 0.0 | 0.3 |
| 0.0 | 0.0 | 0.0 | 0.0 | 0.0 | 0.0 | 0.0 | 0.0 | 0.3 |
| 0.0 | 0.0 | 0.0 | 0.0 | 0.0 | 0.0 | 0.0 | 0.0 | 0.3 |
| 0.0 | 0.0 | 0.0 | 0.0 | 0.0 | 0.0 | 0.0 | 0.0 | 0.3 |
| 0.0 | 0.0 | 0.0 | 0.0 | 0.0 | 0.0 | 0.0 | 0.0 | 0.3 |
| 0.3 | 0.3 | 0.3 | 0.3 | 0.3 | 0.3 | 0.3 | 0.3 | 0.3 |

METHOD AND SYSTEM FOR DETERMINING A CHARGED PARTICLE BEAM EXPOSURE FOR A LOCAL PATTERN DENSITY

RELATED APPLICATIONS

This application is a continuation-in-part of U.S. patent application Ser. No. 17/304,307, filed on Jun. 17, 2021, and entitled "Method and System for Determining a Charged Particle Beam Exposure for a Local Pattern Density"; which is a continuation-in-part of U.S. patent application Ser. No. 16/934,281, filed on Jul. 21, 2020, entitled "Method and System for Determining a Charged Particle Beam Exposure for a Local Pattern Density" and issued as U.S. Pat. No. 11,062,878; which is a continuation of U.S. patent application Ser. No. 16/422,269, filed on May 24, 2019, entitled "Method and System for Determining a Charged Particle Beam Exposure for a Local Pattern Density." and issued as U.S. Pat. No. 10,748,744; the contents of which are hereby incorporated by reference.

BACKGROUND OF THE DISCLOSURE

The present disclosure is related to lithography, and more particularly to the design and manufacture of a surface which may be a reticle, a wafer, or any other surface, using charged particle beam lithography.

Three common types of charged particle beam lithography are unshaped (Gaussian) beam lithography, shaped charged particle beam lithography, and multi-beam lithography. In all types of charged particle beam lithography, charged particle beams shoot energy to a resist-coated surface to expose the resist.

Shaped charged particle beam lithography may be variable shaped beam (VSB) or character projection (CP), in which a shot of a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e., of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In CP, there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a CP system.

Shaped charged particle beam lithography may use either a single shaped beam, or may use a plurality of shaped beams simultaneously exposing a surface, the plurality of shaped beams producing a higher writing speed than a single shaped beam. When a plurality of charged particle beams simultaneously expose a surface, the charged particle beam lithography is often referred to as a multi-beam lithography. Multi-beam lithography may be multiple beams of shaped or unshaped charged particle beam lithography.

In lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the important widths or areas of a feature or the important space between two features or important space areas, those dimensions requiring exquisite control.

In the production or manufacturing of semiconductor devices, such as integrated circuits, optical lithography may be used to fabricate the semiconductor devices. Optical lithography is a printing process in which a lithographic mask or photomask or reticle is used to transfer patterns to a substrate such as a semiconductor or silicon wafer to create the integrated circuit (I.C.). Other substrates could include flat panel displays, holographic masks or even other reticles. Conventional optical lithography typically uses radiation of 193 nm wavelength or longer. Extreme ultraviolet (EUV) or X-ray lithography are also considered types of optical lithography, but use wavelengths much shorter than the 193 nm of conventional optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In NIL, a lithographic mask pattern is transferred to a substrate through contact of the lithography mask with the substrate. The lithography mask of NIL is typically manufactured as a manufacture of a surface using charged particle beam lithography.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create an integrated circuit. Other substrates could include flat panel displays, imprint masks for nano-imprinting, or even reticles. Desired patterns of a layer are written directly on the surface, which in this case is also the substrate. Once the patterned layer is transferred, the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Also, some patterns of a given layer may be written using optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

One goal in integrated circuit fabrication by optical lithography is to reproduce the original circuit design on a substrate by use of a reticle, in which the reticle, sometimes referred to as a mask or a photomask, is a surface which may be exposed using charged particle beam lithography. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. Resolution enhancement technologies performed with a reticle include OPC and inverse lithography technology (ILT).

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is added to improve pattern transference is referred to as "serifs". Serifs are small features that enhance precision or resiliency to manufacturing variation of printing of a particular feature. An example of a serif is a small feature that is positioned on a corner of a pattern to sharpen the corner in the final transferred image. Patterns that are intended to print on the substrate are referred to as main features. Serifs are a part of a main feature. It is conventional to discuss the OPC-decorated patterns to be written on a reticle in terms of main features, that is features that reflect the design before OPC decoration, and OPC features, where OPC features might include serifs, jogs, sub-resolution assist features (SRAFs) and negative features. OPC features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process.

SRAF features are used to improve the transfer of the pattern. It is often the case that the precision or accuracy demanded of the surface manufacturing process for SRAFs are less than those for main features. There are similar decorations introduced by OPC as negative features. Inside of a large feature, there may be narrow spaces introduced to enhance lithographic performance. Narrow spaces are harder to write reliably than equally narrow lines, so these negative features often end up being the most difficult parts to write reliably on a surface.

SUMMARY OF THE DISCLOSURE

Methods for exposing a desired shape in an area on a surface using a charged particle beam system include determining a local pattern density for the area based on an original set of exposure information. A backscatter for a sub area is calculated, based on the original set of exposure information. Dosage for at least one pixel in a plurality of pixels in the sub area is increased, in a location where the backscatter of the sub area is below a pre-determined threshold, thereby increasing the backscatter of the sub area. A pre-PEC maximum dose is determined for the local pattern density, based on a pre-determined target post-PEC maximum dose. The original set of exposure information is modified with the pre-PEC maximum dose and the increased dosage of the at least one pixel in the sub area to create a modified set of exposure information.

Methods for exposing a desired shape in an area on a surface using a charged particle beam system include determining a local pattern density for the area, based on an original set of exposure information. A pre-proximity effect correction (PEC) maximum dose for the local pattern density is determined, based on a pre-determined target post-PEC maximum dose. The pre-PEC maximum dose is calculated near an edge of the desired shape. Methods also include modifying the original set of exposure information with the pre-PEC maximum dose to create a modified set of exposure information.

BRIEF DESCRIPTION OF THE DRAWINGS

FIGS. 3A-3D illustrate various types of shots, as known in the art.

FIGS. 5A-5C and 6A-6C illustrate how dose is affected after PEC for areas with both large and small shapes, as known in the art.

DETAILED DESCRIPTION OF THE EMBODIMENTS

The present disclosure describes methods for reducing charged particle beam write time by reducing the dose required to expose a shot or a pixel. Methods include calculating a pre-proximity effect correction (pre-PEC) maximum dose dynamically, based on a density of patterns to be written. Methods also include calculating the pre-PEC maximum dose in a relatively low-density exposure area by casting an artificial background dose in the area.

The cost of charged particle beam lithography is directly related to the time required to expose a pattern on a surface, such as a reticle or wafer. Conventionally, the exposure time is related to the amount of exposure required to write the pattern. For the most complex integrated circuit designs, forming a set of layer patterns, either on a set of reticles or on a substrate, is a costly and time-consuming process. It would therefore be advantageous to be able to reduce the exposure required to form these patterns, on a reticle and other surfaces, such as by reducing the time required to write them.

Figure 1:
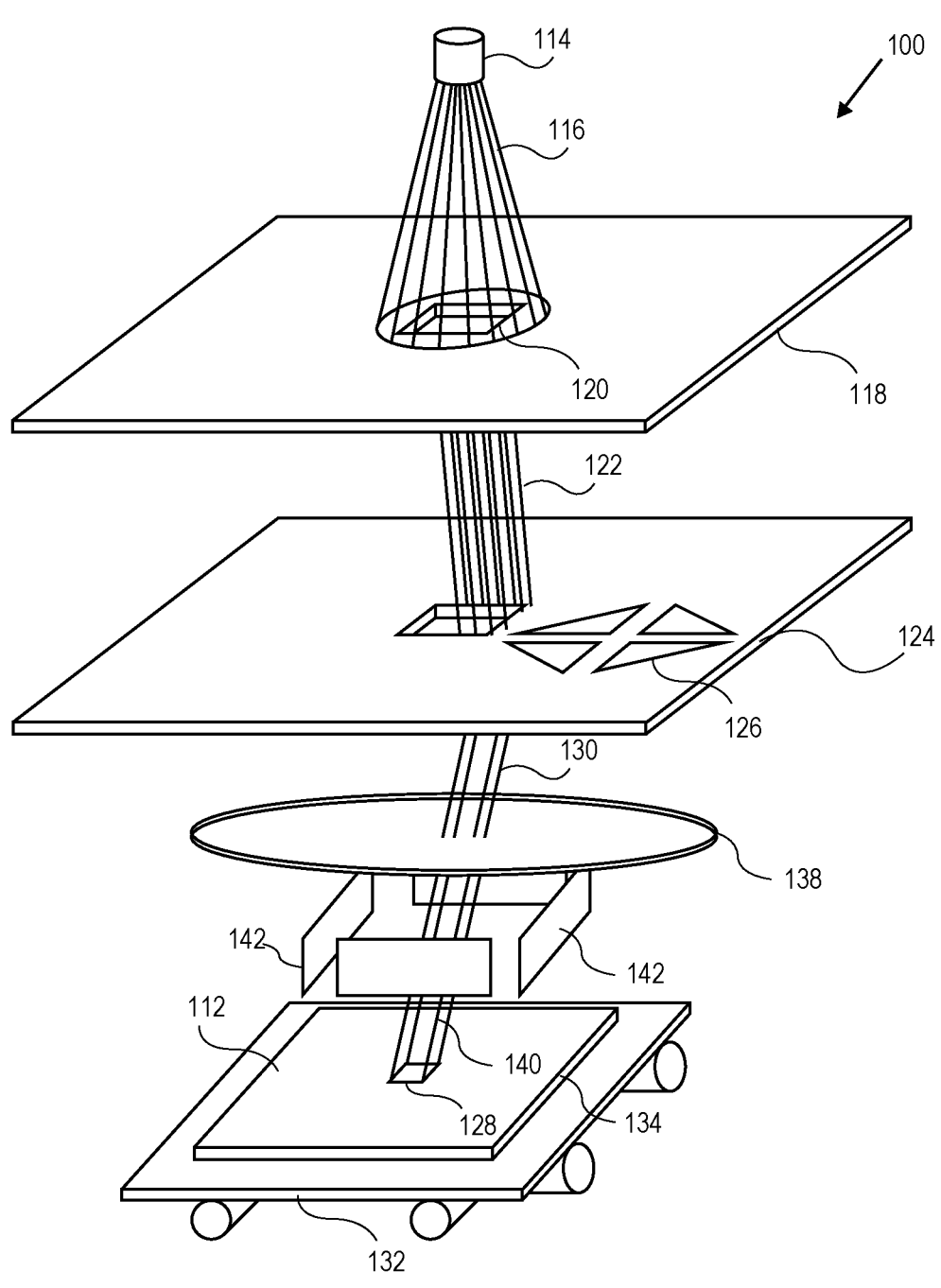
FIG. 1 illustrates an example of a variable shaped beam (VSB) charged particle beam system, as known in the art.

Referring now to the drawings, wherein like numbers refer to like items, FIG. 1 illustrates an embodiment of a lithography system, such as a charged particle beam writer system, in this case an electron beam writer system 100, that employs a variable shaped beam (VSB) to manufacture a surface 112. The electron beam writer system 100 has an electron beam source 114 that projects an electron beam 116 toward an aperture plate 118. The plate 118 has an aperture 120 formed therein which allows the electron beam 116 to pass. Once the electron beam 116 passes through the aperture 120 it is directed or deflected by a system of lenses (not shown) as electron beam 122 toward another rectangular aperture plate or stencil mask 124. The stencil 124 has formed therein a number of openings or apertures 126 that define various simple shapes such as rectangles and triangles. Each aperture 126 formed in the stencil 124 may be used to form a pattern in the surface 112 of a substrate 134, such as a silicon wafer, a reticle or other substrate. An electron beam 130 emerges from one of the apertures 126 and passes through an electromagnetic or electrostatic reduction lens 138, which reduces the size of the pattern emerging from the aperture 126. In commonly available charged particle beam writer systems, the reduction factor is between 10 and 60. The reduced electron beam 140 emerges from the reduction lens 138 and is directed by a series of deflectors 142 onto the surface 112 as a pattern 128. The surface 112 is coated with resist (not shown) which reacts with the electron beam 140. The electron beam 122 may be directed to overlap a variable portion of an aperture 126, affecting the size and shape of the pattern 128. Blanking plates (not shown) may be used to deflect the beam 116 or the shaped beam 122 so as to prevent the electron beam from reaching the surface 112 during a period after each shot when the lenses directing the beam 122 and the deflectors 142 are being re-adjusted for the succeeding shot. Stencil 124 may in itself act as a deflector by having the beam 116 be deflected to hit unopened portions of the stencil 124. Typically the blanking plates are positioned so as to deflect the electron beam 116 to prevent it from illuminating aperture 120. Conventionally, the blanking period may be a fixed length of time, or it may vary depending, for example, on how much the deflector 142 must be re-adjusted for the position of the succeeding shot. Note that VSB systems can be thought of as a special (simple) case of character projection, where the characters are just simple characters, usually rectangles or 45 degree right triangles. It is also possible to partially expose a character. This can be done by, for instance, blocking part of the particle beam. In this disclosure, partial projection is used to mean both character projection and VSB projection.

In electron beam writer system 100, the substrate 134 is mounted on a movable platform or stage 132. The stage 132 allows substrate 134 to be repositioned so that patterns which are larger than the maximum deflection capability or field size of the charged particle beam 140 may be written to surface 112 in a series of subfields, where each subfield is within the capability of deflector 142 to deflect the beam 140. In one embodiment the substrate 134 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 128, generally reduced in size, onto a silicon wafer to produce an integrated circuit. More generally, the mask is used in another device or machine to transfer the pattern 128 on to a substrate (not illustrated).

The shot dosage of a charged particle beam writer such as an electron beam writer system, whether VSB, CP, or a multi-beam machine, is a function of the intensity of the beam source 114, in this VSB example, and the exposure time for each shot. Typically, the beam intensity remains fixed, and the exposure time is varied to obtain variable shot dosages. The exposure time may be varied to compensate for mid-range effect correction (MEC), various long-range effects such as loading-effect correction (LEC) and fogging-effect correction (FEC) and backscatter in a process called proximity effect correction (PEC). In this disclosure, the term PEC is used to describe MEC, LEC, FEC, and backscatter correction. Electron beam writer systems usually allow setting an overall dosage, called a base dosage, that affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current disclosure are targeted for use with charged particle beam writing systems which allow assignment of dosage levels.

Figure 2:
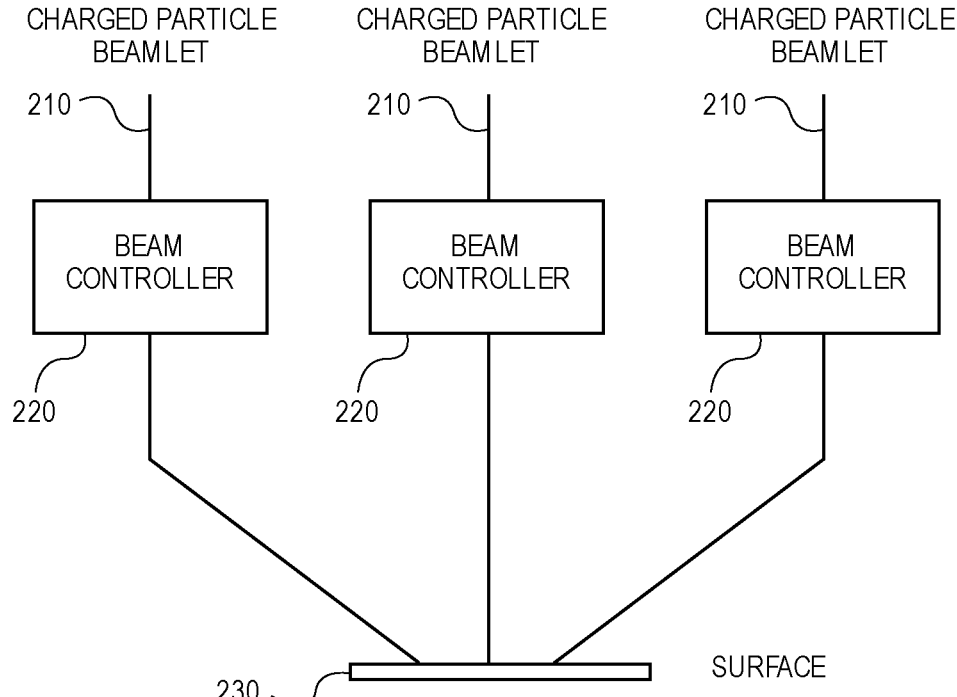
FIG. 2 illustrates an example of an electro-optical schematic diagram of a multi-beam exposure system, as known in the art.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Each beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally, the beamlets will be reduced in size by one or more lenses (not shown) before striking the surface 230, which will typically be coated with a resist. In some embodiments each beamlet may have a separate electro-optical lens, while in other embodiments a plurality of beamlets, including possibly all beamlets, will share an electro-optical lens.

FIGS. 3A-3D illustrate various types of shots. FIG. 3A illustrates an example of a rectangular shot 310. A VSB charged particle beam system can, for example, form rectangular shots in a variety of x and y dimensions. FIG. 3B illustrates an example of a CP shot 320, which is circular in this example. Any shape can be represented as a CP shot, such as octagons or more complex shapes such as the letter E. For purposes of this disclosure, a shot is an exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams.

FIG. 3C illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3D illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
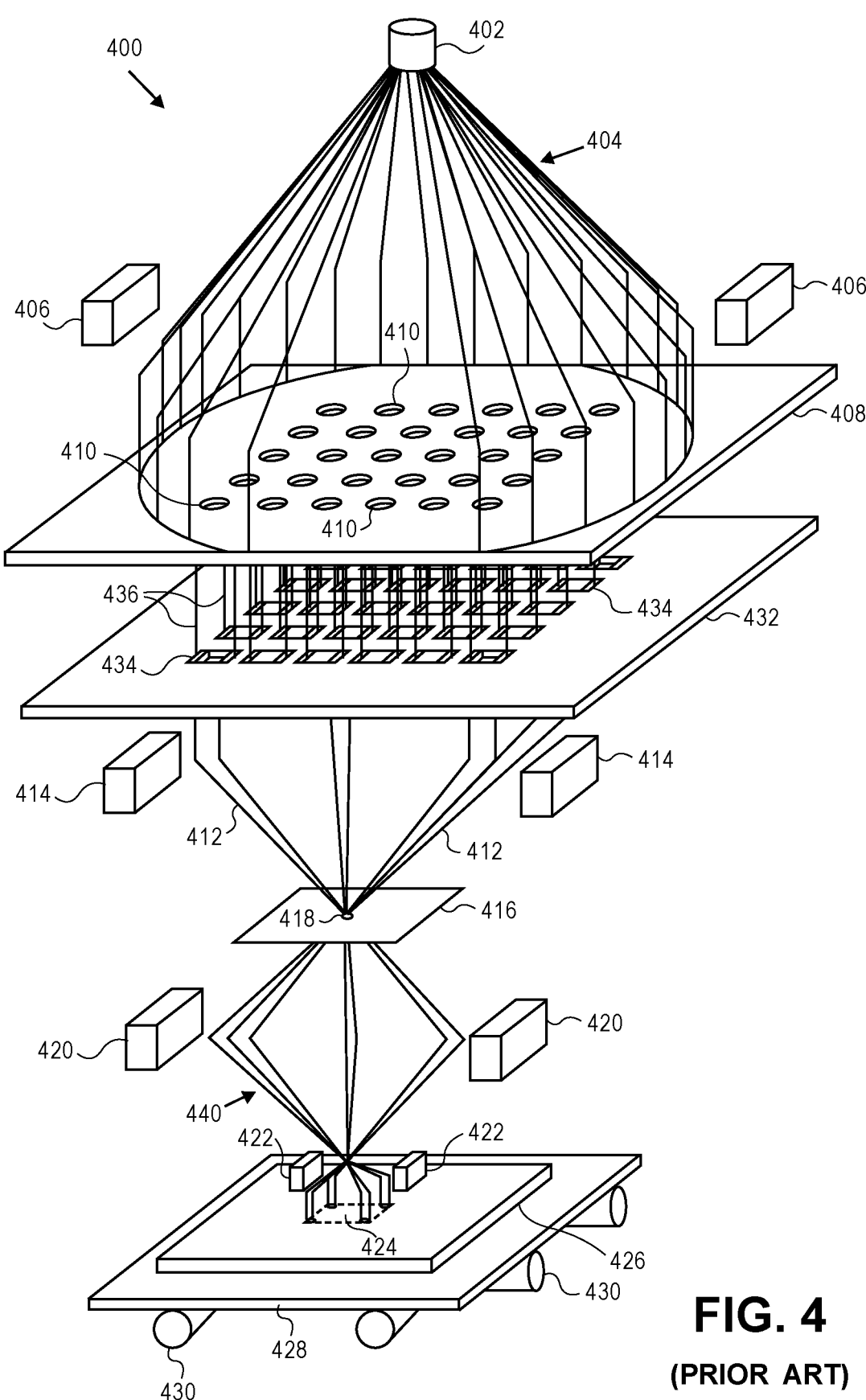
FIG. 4 illustrates an example of a multi-beam charged particle beam system, as known in the art.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. Thus, the multi-beam charged particle beam system 400 comprises the charged particle beam source 402 and aperture plate 408, where the aperture plate 408 comprises a plurality of apertures 410 which the charged particle beam 402 source illuminates. In some embodiments, the multi-beam charged particle beam system comprises a single aperture plate 408. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be circular, as shown in FIG. 4, or may be of a different shape, for example rectangular aperture 120 as shown in FIG. 1. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Typically, multi-beam writers scan the entire area to be exposed. Therefore, the writing time is constant regardless of shape count or shape complexity.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets. While the present disclosure is described in terms of charged particle beam lithography, the methods described may also be applied to laser lithography, particularly to multi-beam laser lithography.

Dose is controlled in all high-precision eBeam writers by controlling the exposure time, rather than by changing the beam's current density dynamically. By practice, it is understood that exposure time can be much more precisely controlled than current density. Because of this, high dose exposure is accomplished by increasing the time that the beam is on compared to low dose exposures. It is conceivable for an eBeam writer to have variable current densities. The present embodiments of this disclosure are applicable if dose control is accomplished at least partially by controlling the exposure time. The exposure time for each beamlet 436 in the beamlet group can be controlled individually using blanking controllers 434. Therefore, multi-beam write time is determined by the maximum dose that needs to be applied. In writers where the stage stops for each beamlet group—for example, a stripe—the highest-dosage beamlet affects the exposure time for the entire stripe. In writers with constant-speed stages, the speed could be constant for the entire design, which may be a subset of a reticle, a full reticle or a wafer or any other surface, or partially constant for a period of time. Therefore, the highest dosage beamlet in a stripe can determine the stage speed and therefore determine the write time for an entire design or surface. Even in variable speed stages, the speed cannot change too quickly as the stage is heavy in order to provide stability, and accelerating or decelerating speed takes a lot of energy and is a source of vibration and blur.

In advanced process nodes, features that need to be precisely written on the mask are less than 3× the size compared to the typical combined blur radius of the forward scattering and resist blur of a typical resist used to print the mask fast enough to be of commercial value. In typical leading edge masks, sub-resolution assist features (SRAFs) of less than 60 nm in width are written on the mask with the combined blur being above 20 nm in range. On masks for EUV lithography, it is generally expected that SRAFs of approximately 30 nm width will become commonly required on masks. In the optical proximity correction (OPC) or inverse lithography technology (ILT) step that produces the mask shapes, wafer performance can be enhanced further if smaller shapes (such as SRAFs) can be printed accurately. But it is also critical that mask shapes produced by OPC/ILT can actually be reliably produced on mask, across mask process variation. Mask design rules, such as minimum allowed feature width and minimum allowed feature spacing on mask, are established that represent the trade-off. OPC/ILT needs to guarantee that the output adheres to the mask design rules. The mask makers need to produce masks that adhere to the mask design rules accurately across manufacturing variation to a certain agreed upon specification. Narrower shapes are more difficult to write on a mask. A small square shape is the most difficult to write. But since small square shapes have smaller impact on wafer performance, typically, a need to write narrow SRAFs accurately is important in leading edge mask processing.

Writing such small shapes on a mask in the presence of other shapes that are larger on the same mask typically is accomplished with dose modulation. Since overall mask write time is one of the principal drivers of mask costs, a resist whose sensitivity is sufficient to achieve the desired accuracy for the larger "main" features is chosen to represent the accuracy-speed/cost trade-off. But writing SRAFs and other smaller shapes also needs to be done accurately, and a common technique is to enhance—i.e., increase—or partially enhance the dose of the SRAFs to cause them to be printed better.

In the industry, the amount by which a normal dose is enhanced can typically vary from 1.2 times the normal dose to 3 times the normal dose, although the dose may be any multiple of normal dose. More enhancement leads to longer write times but can lead to more accurate printing of smaller shapes. FIGS. 5A-5B illustrate the difference between a large enough shape 502 and its dose profile (i.e., dose curve) 512 and a smaller SRAF shape 506 and its dose profile 522, both shot with normal dose measured along the lines 504 and 508 through shot outlines of shapes 502 and 506, respectively, with the same resist threshold as indicated by the line 514. Shapes 502 and 506 are broken up to indicate rectangular shapes that are much longer than they are wide where the normal dose is used to shoot each shape on a resist with a threshold of half the normal dose. Doses below the resist threshold will not print.

In a VSB machine, the shot outlines are the shapes of eBeam projection as directed to the writer. In a multi-beam machine, the shot outlines are the shapes of the desired shapes as directed to the writer, resulting in a rasterization to pixels and eBeam projection of various doses as appropriate for the pixels used to draw the shape. To simplify comprehension, in this disclosure, dose profiles are drawn and explained as though the machines are VSB, although the embodiments may also apply to multi-beam. In a multi-beam machine, the rasterization to pixels further complicates the dose profile, and is dependent on the location of the shape relative to the pixel grid. For comprehension of the concepts of this disclosure, these additional complexities of multi-beam writing are not relevant.

For large enough shapes, the dose profile 512 reaches a plateau at the normal dose. This plateau is at the same dose even if the width of the shape 502 is larger. For smaller shapes as illustrated by shape 506, there is not enough energy to have the peak of the dose profile reach the normal dose. The shape of the dose profile 522 does not have a plateau. In addition, the dose profile 522 does not cross the resist threshold 514 at the same location as the width of the shape 506. Because there is not sufficient energy, the exposed shape on the resist will be narrower than the desired width.

Dose margins of the left edge of the shapes 502 and 506 are indicated by the edge slopes 516 and 528, respectively. Slope 528 is shallower than slope 516. The narrower the shape 506, the lower the dose profile and the shallower the slope 528 will become. Once the shape 502 is wide enough for dose profile 512 to hit the plateau, wider shapes will not change the slope 516. Shallower slopes have worse dose margin, meaning that the critical dimension (CD) that is the width of the shape is subject to more variation given a certain dose variation. The term dose margin here describes the tolerance of a pattern defined by a set of charged particle beam shots to manufacturing variations of all types including dosage related variations. A better dose margin indicates a higher tolerance. For those skilled in the art, it is generally understood that resilience to dose variation is a good proxy for many sources of manufacturing variation. To improve resilience to manufacturing variation as indicated by dose margin, one conventional method is to use a higher than normal base dose for smaller shapes, such as depicted by dose profile 532 of FIG. 5C. A base dose of more than 1.0 is used in this example where the dose amount is chosen so as to have the CD indicated by the distance between the points of dose profile 532 that cross the resist threshold 514 be the desired width of the target shape 506. The industry uses many combinations of dose adjustment and shape adjustment. FIG. 5C is one example where only dose adjustment is deployed. In this example, once the dose is calculated for shape 506, the dose margin may be measured by calculating the slope 538 of the dose profile 532 where it crosses the threshold 514. Note that edge slope 538 is better (i.e., has a steeper slope) than edge slope 528, but may still be worse than edge slope 516.

Dose margin is also important for printability of the small features because of contrast. Contrast is the difference in amount of energy applied to the resist in the immediate neighborhood interior to the exposed area versus in the immediate neighborhood exterior to the exposed area. Immediate neighborhood in semiconductor mask processing may be a few nanometers to a few tens of nanometers. Because a dose profile is a continuous function in the length scale of concern, dose margin and contrast are highly correlated to each other. Insufficient contrast will make a shape unresolvable. Reducing the minimum size of the shapes that can reliably resolve with a given resist is important to the economics of mask making.

There is another factor that influences the amount of dose that needs to be cast directly by the eBeam writer to print a shape on the surface. It is called proximity effect correction (PEC) which corrects for backscatter of electrons cast by eBeam "shots" around the area of concern. FIGS. 6A-6B show the resulting dose corresponding to the shots of FIGS. 5A-5B after PEC is applied. In FIG. 6A, backscatter of electrons cast by shape 502 and its surrounding shots, typically within distance from a shot on the order of 10 μm, is indicated by the dashed line representing a backscatter 618. If the surrounding area is densely populated with exposures, the backscatter 618 will be higher. If the surrounding area is sparsely populated, the backscatter 618 will be lower, perhaps near zero. PEC, as generally practiced, iteratively optimizes the applied dose for a sufficiently large shape 502 so that the dose applied to shoot shape 502 causes the width of shape 502 to be printed accurately despite the added dose contributed by backscatter. The corrected dose profile 612 of the exposure (excluding backscatter) has less dose than dose profile 512. The edge slope 616 is shallower than edge slope 516. Higher amounts of backscatter received from the adjacent areas make dose margin worse. FIG. 6B shows the same PEC applied to smaller shapes, such as for SRAFs. Since PEC is normally applied the same way to all shapes of all sizes, the resulting post-PEC dose profile 622 becomes even smaller in magnitude after PEC is applied (not including the base dose coming from backscatter as shown by the horizontal dashed line for backscatter 618) as compared to dose profile 522. Edge slope 628 therefore is even shallower than edge slope 528, and substantially shallower than edge slope 616, making dose margin worse and these shapes much more susceptible to effects of manufacturing variation. FIG. 6C shows the post-PEC dose profile of the shot described in FIG. 5C where the dose was increased to meet the desired critical dimension (CD). Edge slope 638 is shallower (worse) than pre-PEC edge slope 538 before PEC is applied, but is better than the normal dose, post-PEC edge slope 628.

Backscatter is caused by charged particles, such as electrons, that "bounce" back after colliding with the resist and materials under the resist. The effective radius of backscatter may be, for example, 10 microns-much larger than the size of a shot. Therefore, all the backscatter from nearby shots within that effective radius of a shot will add dosage at the shot's position. If not corrected for, backscatter may add more dose to the shot than the shot's intended dose, causing patterns to register wider—more so in areas of high exposure density.

Figures 7A, 7B, 7C, 7D, 7E, 7F, 7G:
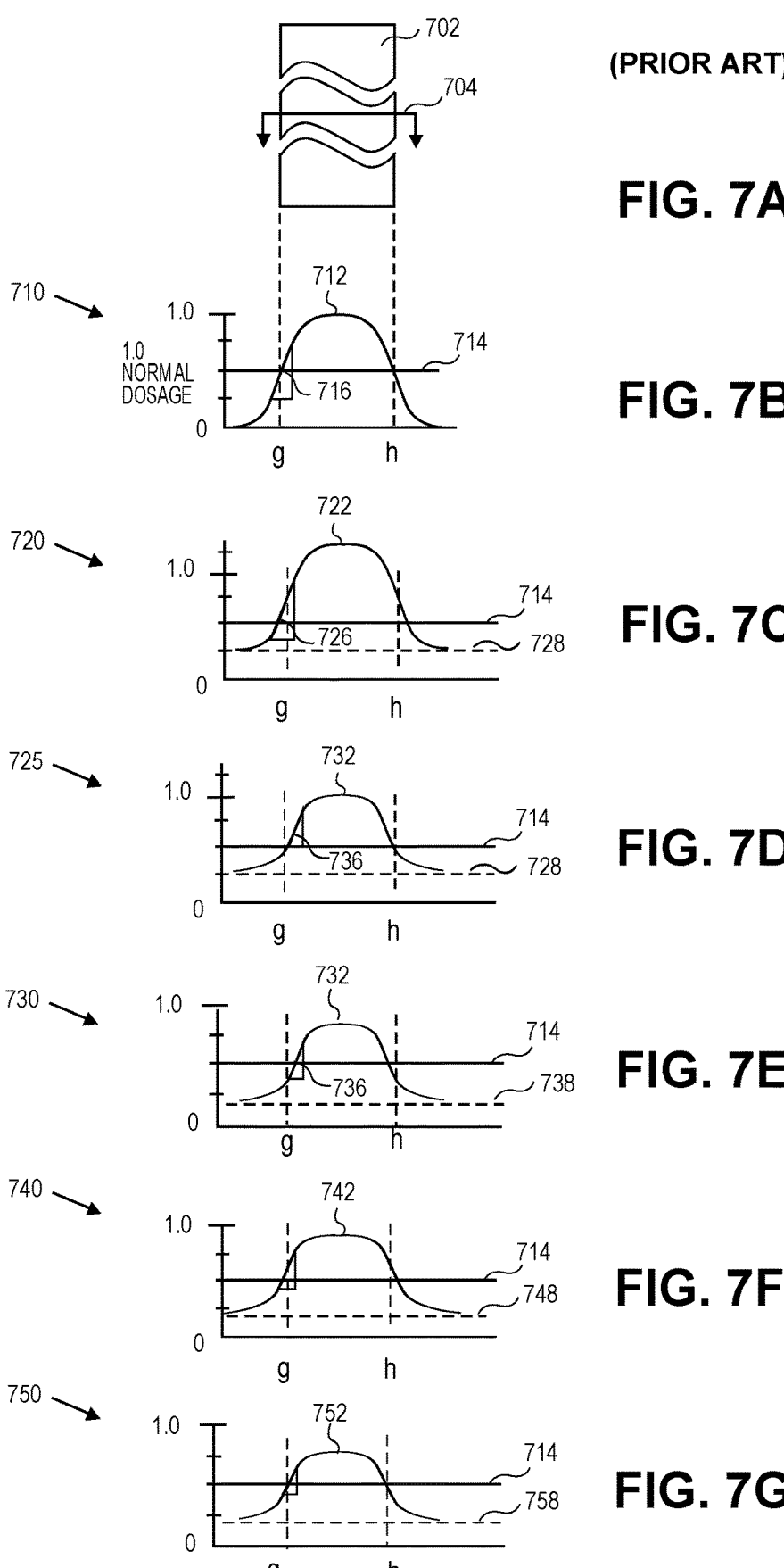
FIGS. 7A-7G illustrate PEC iterations and resulting dosage curves of a rectangular shape, as known in the art.

FIGS. 7A-7G show an iteration sequence applied by PEC to correct dose amounts used to shoot each shape to correct for backscatter effects as known in the art. FIG. 7A illustrates an example of an outline of a rectangular shot 702. The breaks show that shot 702 may be arbitrarily long in the vertical direction. The width of the shot 702, the distance between "g" and "h", for illustration purposes is assumed to be between 100 nm and 300 nm in this example presuming a commonly used mask production process, significantly less than the assumed backscatter range of approximately 10 μm. Shot sizes of multibeam machines are typically 5-20 nm. In the case of a multibeam machine, a collection of shots combined together shoots a shape such as shot 702. Backscatter applies to a single shot in the same way as a collection of shots and PEC correction is applied in the same way. FIG. 7B illustrates an example of a dosage graph 710 illustrating dosage along the line 704 through shot outline 702 with a normal shot dosage, with nearly no backscatter. Other long-range effects are also assumed to contribute nothing to the background exposure of FIG. 7B, leading to a near-zero background exposure level. The total dosage delivered to the resist is illustrated on the y-axis, and is 1.0 times the normal dosage. Because of the near-zero background exposure, the total dosage and the shot dosage are nearly the same. Dosage graph 710 also illustrates a resist threshold 714 at half the normal dosage. The CD variation of the shape represented by dosage graph 710 in the x-direction is inversely related to the slope of the dosage curve (i.e., dose profile) 712 at x-coordinates "g" and "h" where it intersects the resist threshold 714. The edge slope 716 of dosage curve 712 at threshold 714 is illustrated as the hypotenuse of a right triangle.

The FIG. 7B condition of near-zero background exposure is not reflective of actual designs. Actual designs will typically have many other shots within the backscattering distance of shot 702. FIG. 7C illustrates an example of a dosage graph 720 of a shot with a normal dosage with a backscatter 728 resulting from a 50% exposure density. In dosage graph 720, dosage curve 722 illustrates the cross-sectional dosage of shot 702 in addition to the background exposure (backscatter 728). The edge slope 726 of the dosage curve 722 at threshold 714 is illustrated as the hypotenuse of a right triangle. The CD variation of curve 722 is greater (worse) than the CD variation of curve 712, as indicated by the shallower edge slope 726 where curve 722 intersects the resist threshold 714 beyond points "g" and "b", compared to edge slope 716. The shallower edge slope 726 is due to the resist threshold intersecting the lower part of the dose curve where dose margin is worse due to the background exposure caused by backscatter 728. The intersection of the dosage curve 722 at the resist threshold 714 is wider than points "g" and "h" indicating that the printed CD would be larger than the desired size. The backscatter 728 "pre-exposes" the resist, so shooting dosage curve 722 with normal dosage in the presence of backscatter 728 causes the CD to print larger than desired.

FIG. 7D illustrates a new dose curve 732 after PEC. Interim dose graph 725 still shows 50% backscatter 728 but with a reduced dose curve 732, calculated such that with the current backscatter the intersection of dose curve 732 and resist threshold 714 measures exactly at "g" and "h." This is the result of a first iteration of PEC to correct the overdosing that comes from the presence of backscatter. In this iteration, the backscatter amount is assumed to be the same as backscatter 728 because there is no way to know what the new backscatter will be after PEC is performed for all surrounding shots. PEC computation decreases the dose applied to shot 702 so that the resist threshold 714 intersects dose profile 732 at "g" and "h". The edge slope 736 of the dosage curve 732 at threshold 714 is illustrated as the hypotenuse of a right triangle. Note that slope 736 is shallower than slope 716 as PEC makes dose margin worse.

Dose graph 730 of FIG. 7E illustrates why PEC needs multiple iterations. The PEC calculation performed as illustrated in FIG. 7D bits "g" and "h" exactly, if and only if backscatter 738 is identical to backscatter 728. But since PEC is performed for all shots, the backscatter 738 will be decreased because all shots around this shot would have PEC applied to them, resulting in each shot dose decreasing (as this shot's dose was decreased from curve 722 to curve 732). The new backscatter is indicated in FIG. 7E as backscatter 738. Backscatter 738 is lower than backscatter 728. As can be seen, the reduction in backscatter results in a smaller registered pattern size than the desired size of the original shot 702.

The second iteration of PEC corrects for this by recomputing PEC with this new (reduced) backscatter amount (backscatter 738). Now with lower backscatter, dose profile 732 needs to be enhanced with increased dose to hit targets "g" and "h" to print a shape such as shot 702 with the correct CD.

Enhancing dose for PEC on all shapes of a design as indicated in dose graph 740 of FIG. 7F results in a dose profile 742 that is higher than dosage curve 732. Subsequently, after all other shapes in the neighborhood are adjusted a higher backscatter 748 than backscatter 738 will result. The third iteration of PEC corrects for this by recomputing PEC again with this new (increased) backscatter amount. These iterations continue alternately until there is convergence within a pre-determined tolerance of the backscatter amount as indicated at dose level 758 in dose graph 750 of FIG. 7G and dose profile 752 correctly producing the desired size of original shot 702 at threshold 714. The converged dose amounts are then used to shoot the individual shapes on the mask, resulting in a backscatter corrected set of doses for all shapes as the PEC result.

Figure 8A:
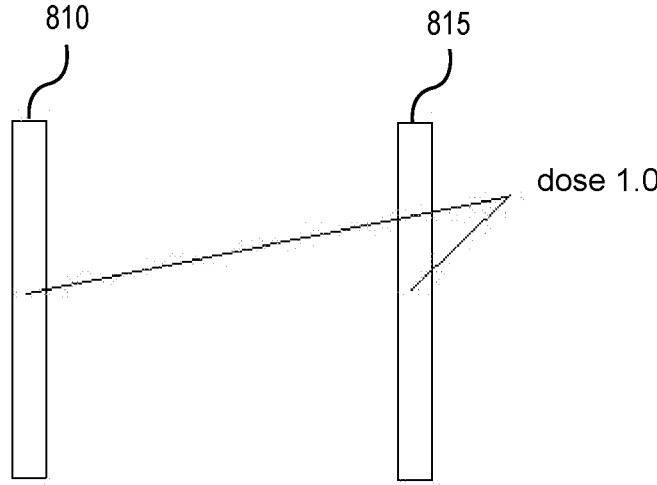
FIGS. 8A-8F illustrate examples of low-density exposure to high-density exposure, as known in the art.
Figure 8B:
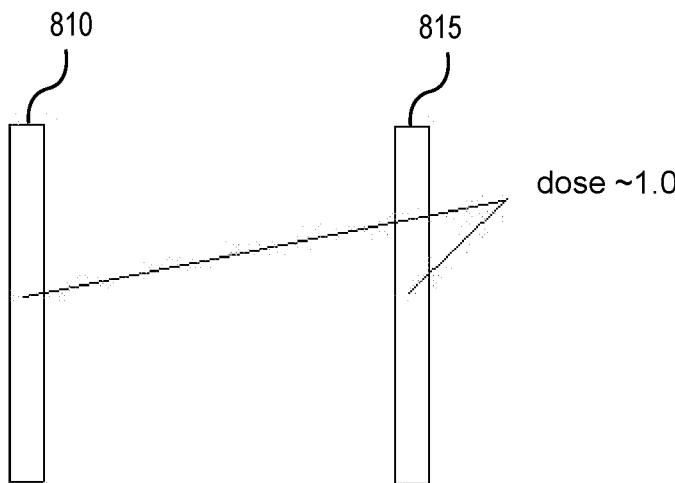

FIGS. 8A-8B illustrate an example of how PEC affects isolated shapes. In FIG. 8A shapes 810 and 815 are isolated patterns in an area otherwise occupied by no other exposure. Initial dose can be calculated at 1.0 times the normal dose for both shapes. FIG. 8B shows that dosages calculated after PEC are still approximately 1.0 of the normal dose, being virtually unaffected as a result of no surrounding backscatter other than from backscatter contributed by shapes 810 and 815.

Figure 8C:
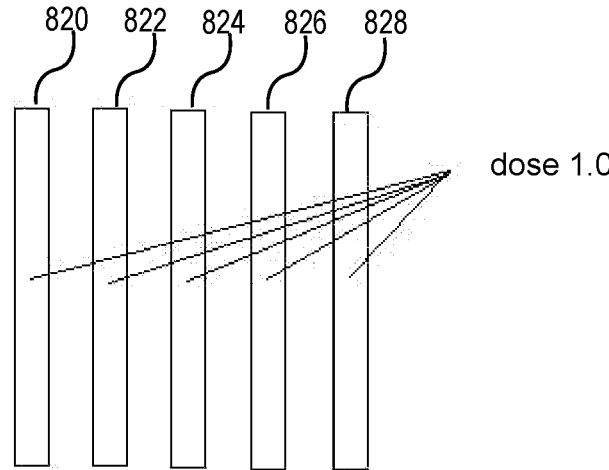
Figure 8D:
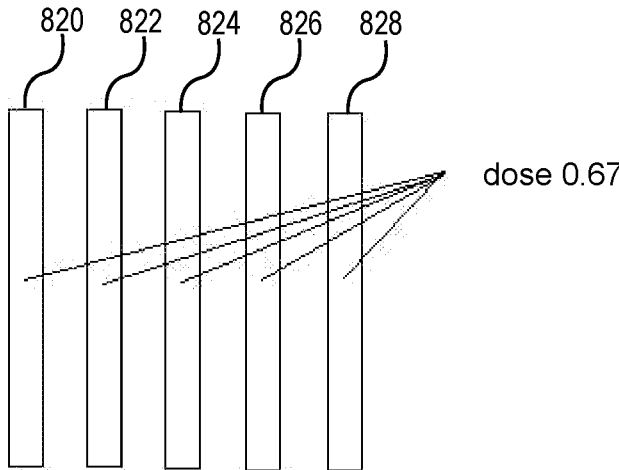

FIGS. 8C-8D illustrate an example of how PEC affects shapes in 50% exposure density areas; that is, in which 50% of the area is covered with patterns. In FIG. 8C, shapes 820, 822, 824, 826 and 828 are shown in a repeated line and space pattern where the dosed shape and the space in between are equal in width, with the line and space pattern repeated for an effective radius of 10 μm in all directions. Initial dose for each shape can be calculated at 1.0 times the normal dose.

FIG. 8D shows as an example that because of surrounding backscatter from neighboring shapes, during PEC, dosage is reduced to 0.67 of the normal dose for all shapes in the repeated pattern.

Figure 8E:
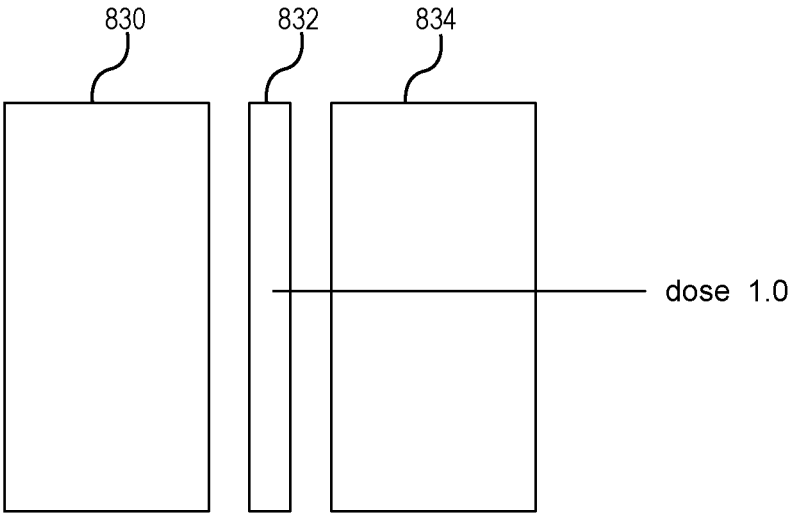
Figure 8F:
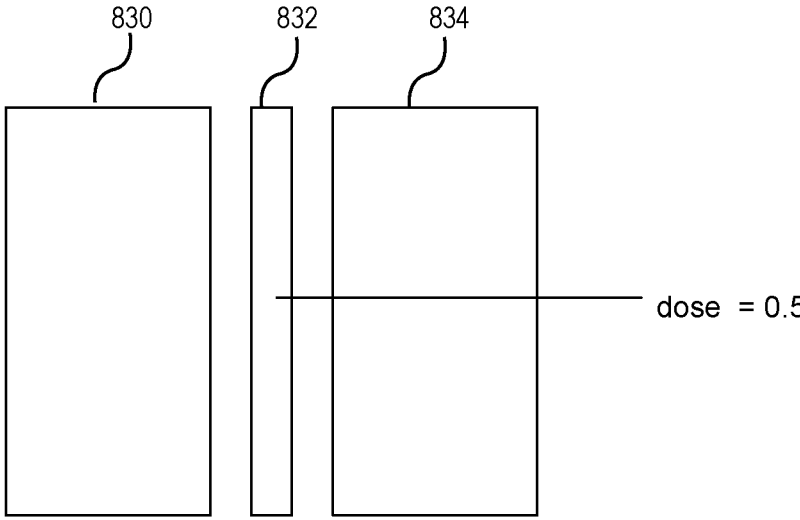

FIGS. 8E-8F illustrate an example of how PEC affects shapes in high density areas. In FIG. 8E, shapes 830, 832 and 834 are shown where shape 832 is the shape of concern. Shapes 830 and 834 are large areas of exposure of width greater than an effective radius of 10 μm in width, and the pattern is extended above and below by an effective radius of 10 μm. Initial dose for each shape can be calculated at 1.0 times the normal dose. FIG. 8F shows that because of surrounding backscatter from neighboring shapes during PEC, dosage is reduced to, for example, 0.5 of the normal dose for shape 832. PEC mathematically reduces the dose of each exposure by just the right amount to make the CD equal to what the CD would have been without backscatter for a sufficiently large shape. PEC therefore effectively makes the effect of backscatter disappear. Backscatter is always a positive value. Therefore, PEC always reduces dose to compensate.

Because PEC works by "flattening" the Gaussian, the dose needed to expose the shape in an area of high backscatter is significantly less. The difference in required dose between the area with high backscatter (the shape is surrounded by high dose density) vs. an area with no backscatter (the shape is surrounded by low dose density) can be as much as 2X or more.

The modified dose $D_{pec}$ of a pixel or a shot with normal dose for the first iteration of PEC calculation is given by the following formula:

$$D_{pec} = \frac{T_{emp}}{T_{emp} + \eta[\text{dose density}]}$$

At the resist threshold of 0.5 of the normal dose, $T_{emp}$, is the fraction of forward scatter at the resist threshold and eta($\eta$) is the normalization constant. With $T_{emp}$ of 0.5, an eta($\eta$) of 0.5 and an exposure density of 100%, $D_{pec}$ is calculated to be 0.5. If an SRAF is assigned to be shot with twice the normal dose (2.0 times) but is in an area of high density with high backscatter, the pixels or shots will end up with approximately 1.0 times the normal dose as 0.5*(2.0) =1.0 after the first iteration of PEC calculation.

This is because the area is largely exposed with energy from backscatter. So only a fraction of the energy from this pixel or shot is needed to cast enough energy to reach the threshold for exposing the resist.

Areas with near-zero backscatter take the most eBeam dose per shot. Therefore, in a constant write time multi-beam writer, the write time of the entire machine is paced by the writing of those isolated patterns with the highest enhanced dose, typically for narrow shapes such as for SRAFs. Typical test masks have patterns in high density areas mixed with patterns in low density areas. Typical production masks have much less variation. Some masks have patterns that are all dense (for example 70% exposure density on the average). Other masks have patterns that are all sparse (for example, 25% exposure density on the average). But as many production masks combine some test patterns in them, low variation cannot be assured. In any case, multi-beam writing speed, particularly for constant write time writers, is dictated by the pixel that combines a high enhanced dose in an environment that has less backscatter cast. To a lesser degree, but still significantly, the writing speed of variable write time writers such as VSB writers and possibly multi-beam writers are paced by the shot that combines a high enhanced dose in an environment that has less backscatter.

Artificial Background Dose

In some embodiments, an artificial background dose is introduced in areas of otherwise low backscatter to reduce pixel or shot dose and hence reduce overall write time. The pixels or shots will have a lower dose after PEC as a result, decreasing the maximum of the pixel or shot doses for a mask or a section of the mask, increasing the stage moving speed, and thereby reducing the overall write time significantly. In some embodiments the area comprises the entire area to be exposed. In other embodiments the area comprises a sub area of the entire area to be exposed. That is, the entire area may comprise sub areas of pixels to be exposed at once or during an exposure pass. In some embodiments the sub area is sufficiently small that backscatter is approximately the same for every location in the sub area.

Figure 9A:
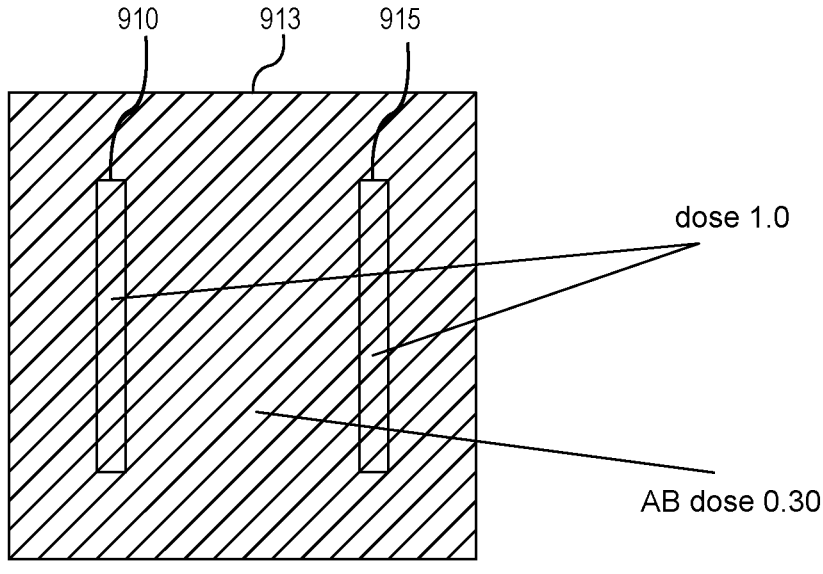
FIGS. 9A-9B illustrate a low-density exposure area, with artificial background dosage added in accordance with embodiments of the current disclosure.
Figure 9B:
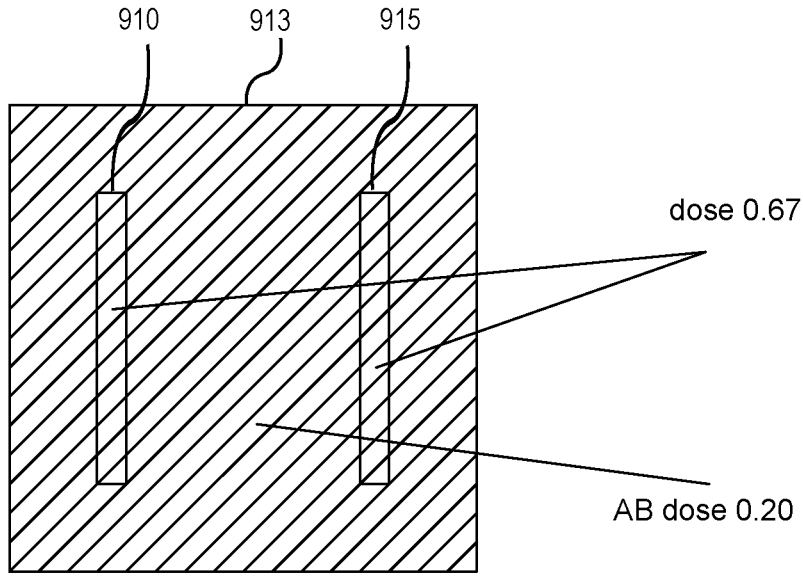

FIGS. 9A-B illustrate how introducing artificial background dose in accordance with some embodiments can mimic a 50% density similar to FIGS. 8C and 8D. FIG. 9A shows similar isolated shapes 910 and 915 as FIG. 8A but with an added artificial background dose ("AB dose") over sub area 913. Initial dosage is set at 1.0 times the normal dose for shapes 910 and 915 as before and an artificial background dose that is 0.30 of the normal dose in sub area 913 in this example. It is important to note that the added dosage applied in sub area 913 in locations where the backscatter is below a pre-determined threshold, is below the threshold to print. In some embodiments, dosage is increased for a pixel in a plurality of pixels in the sub area. In some embodiments, dosage that is increased for the pixel in the plurality of pixels in the sub area when combined with other pixels in the plurality of pixels may not form a pattern or feature. FIG. 9B shows similar dosage reduction at 0.67 of the normal dose after PEC as FIG. 8D, reducing overall dosage required to print previously isolated shapes 910 and 915. In some embodiments added dosage in sub area 913 is also reduced to 0.20 of the normal dose after PEC. In this simplified example, sub area 913 is assumed to extend beyond the backscatter radius away from shapes 910 and 915. In most situations, sub area 913 can be much reduced in size so as to add the artificial background dose only in the area immediately surrounding shapes 910 and 915. Other such artificial background dose for other areas surrounding shapes 910, 915, and in sub area 913 will contribute actual backscatter to these shapes. In the present embodiments, all such energy contributions are computed using PEC when the actual post-PEC dose of shapes 910 and 915 are computed. In some embodiments, the dose in sub area 913 is not modified by all iterations of PEC. In some embodiments, the dose in sub area 913 is modified through all iterations of PEC.

Figures 10A, 10B, 10C, 10D, 10E, 10F:
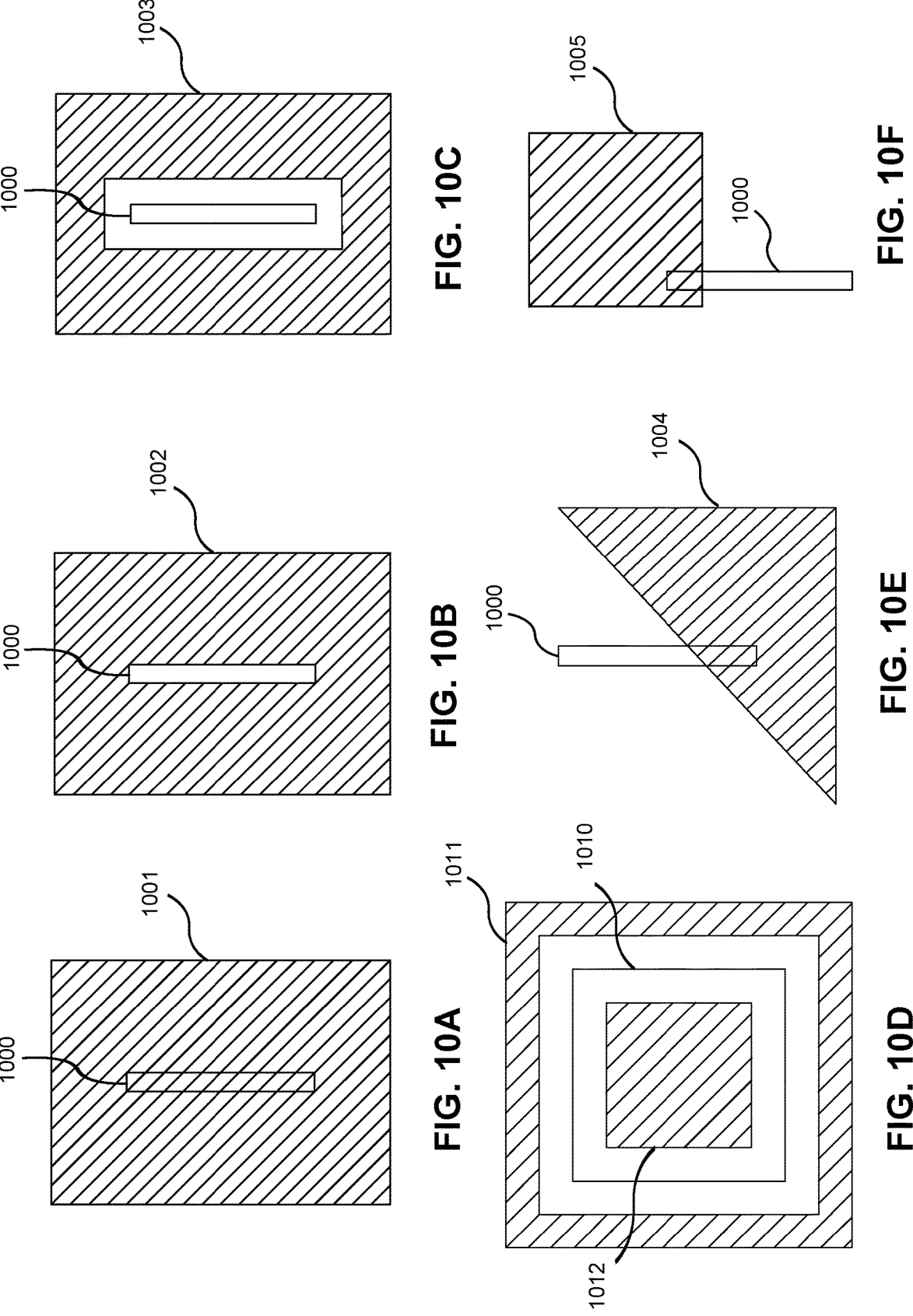
FIGS. 10A-10F illustrate example embodiments of artificial background dose.

Artificial background dose can be added to areas where backscatter is low enough where post-PEC dose margins are sufficiently better than "good enough" according to some parameter set by practice. FIGS. 10A-10F illustrate a few examples of artificial background dose, where the added artificial background dose is added to a sub area (distinguished with hashed fill lines) that will be shot in combination with the desired shape. The artificial background dose is a sub-threshold exposure; that is, a dosage lower than the resist threshold required to print. FIG. 10A shows how artificial background dose in sub area 1001 can be cast over an area containing a desired shape 1000 to be printed on a surface, completely covering the desired shape. FIG. 10B shows artificial background dose in sub area 1002 in the area except where the desired shape 1000 already exists, so as not to cover the desired shape. FIG. 10C shows artificial background dose in sub area 1003 surrounding the desired shape 1000 with some margin, for example up to 3 sigma away from the desired shape's edge. For large enough shapes as in a desired shape 1010 in FIG. 10D, artificial background dose in sub areas 1011 and 1012 are applied more than a pre-determined distance from an edge of the desired shape 1010 to be printed on a surface. Creating a margin around a feature, for example an edge, a line end or an SRAF, artificial background dose applied in this way in some cases may be better than just increasing background exposure everywhere. Adding artificial background dose over a desired shape, such as desired shape 1010, creating a fill dose shown in sub area 1012, may be applied closer than a pre-determined distance from the inner edge of desired shape 1010. That is, the sub area 1012 may be placed inside the desired shape 1010, with a gap between the sub area 1012 and the desired shape 1010 being less than a pre-determined distance. In some embodiments, the increased dosage of the at least one pixel in the plurality of pixels in the sub area is applied closer than the pre-determined distance from an inner edge of the desired shape in the area on the surface. Artificial background dose can alternatively be added anywhere to the area to be exposed as shown for example, in each of FIGS. 10E and 10F, with artificial background dose in sub areas 1004 and 1005 partially covering the desired shape 1000, respectively.

Dynamic Maximum Dose

Figure 11:
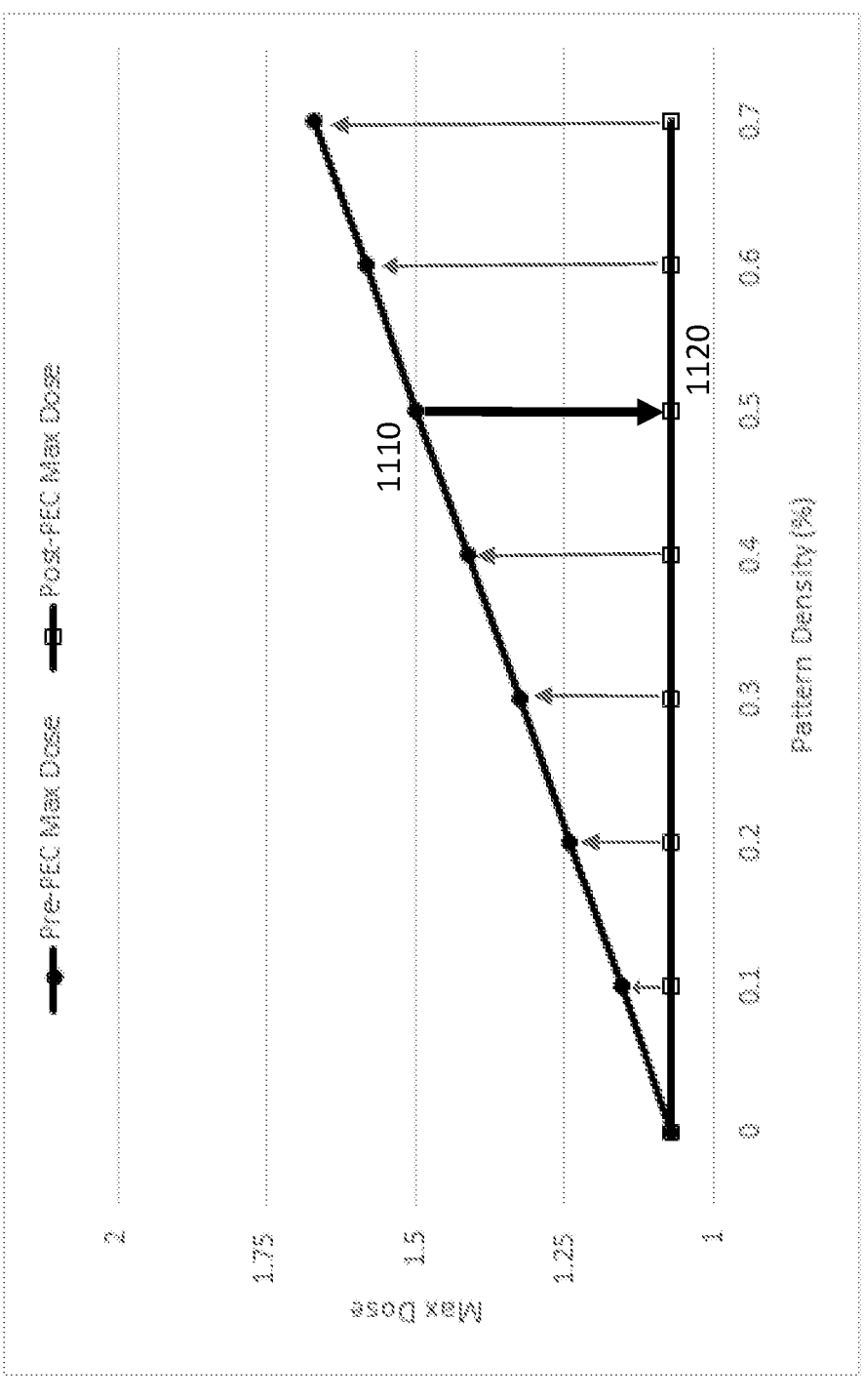
FIG. 11 illustrates example dynamic maximum dose adjusted by local pattern density, in accordance with some embodiments.

Artificial background dose can safely be added up to a certain dose level below the resist threshold. Machine write time depends on the post-PEC maximum dose. One way to ensure a specified write time is to limit the post-PEC maximum dose and truncate any dose above it. However, truncating dose can cause print errors. In the present embodiments, methods, which may be referred to as Dynamic Maximum Dose (DMD), are described in which a target post-PEC maximum dose is chosen and used to determine a pre-PEC maximum dose. The calculations are performed dynamically, based on the pattern density, such that the resulting post-PEC doses do not exceed the chosen (target) post-PEC maximum dose, eliminating the need for dose truncation. In some embodiments a target post-PEC maximum dose is input. FIG. 11 shows an example of calculating a pre-PEC maximum dose to meet a target post-PEC maximum dose, using a line space pattern at 50% density (i.e., value of 0.5) as an example scenario. In this embodiment, a pre-PEC maximum dose 1110 of 1.5 will result in a post-PEC maximum dose 1120 of 1.07 per conventional PEC methods. This calculation of the post-PEC maximum dose 1120 from the pre-PEC maximum dose 1110 is indicated by the downward arrow in FIG. 11. A pre-PEC dose of 1.5 would normally print features larger than their desired size, however, such a dose may be desired for small features as a method of performing linearity correction. In accordance with some embodiments, a user may decide that the post-PEC dose 1.07 is sufficient for all pattern densities that are to be written and may choose dose 1120 (dose value of 1.07) as the target post-PEC maximum dose. Consequently, for other pattern densities (e.g., 10%, 20%, etc.) a pre-PEC maximum dose is then calculated based on the chosen post-PEC maximum dose (i.e., a pre-PEC dose that will result in the target post-PEC maximum dose) as indicated by the upward arrows in FIG. 11. The calculations between pre-PEC and post-PEC doses may be performed using conventional PEC methods, although calculating a pre-PEC dose based on a target post-PEC maximum dose and adjusted for a pattern density being written as disclosed in the present embodiments has not been contemplated in the art.

Returning to FIGS. 8A-8F, in particular FIGS. 8B, 8D and 8F, these figures illustrate that as pattern density increases, a dose as corrected by PEC is reduced in order to compensate for additional exposure by increased backscatter. In addition, the increase in backscatter and resulting PEC reduction of dose also reduces dose margin as illustrated in FIGS. 7A-7G. Therefore, a normal dose would result in lower dose margin as pattern density increases. In some embodiments, providing sufficient dose margin includes increasing dose such that the post-PEC maximum dose is within a pre-set limit (such as 0.7 to 1.3 times the normal dose) and performing linearity correction to ensure the size of the shape is correct.

Figures 12A, 12B, 12C:
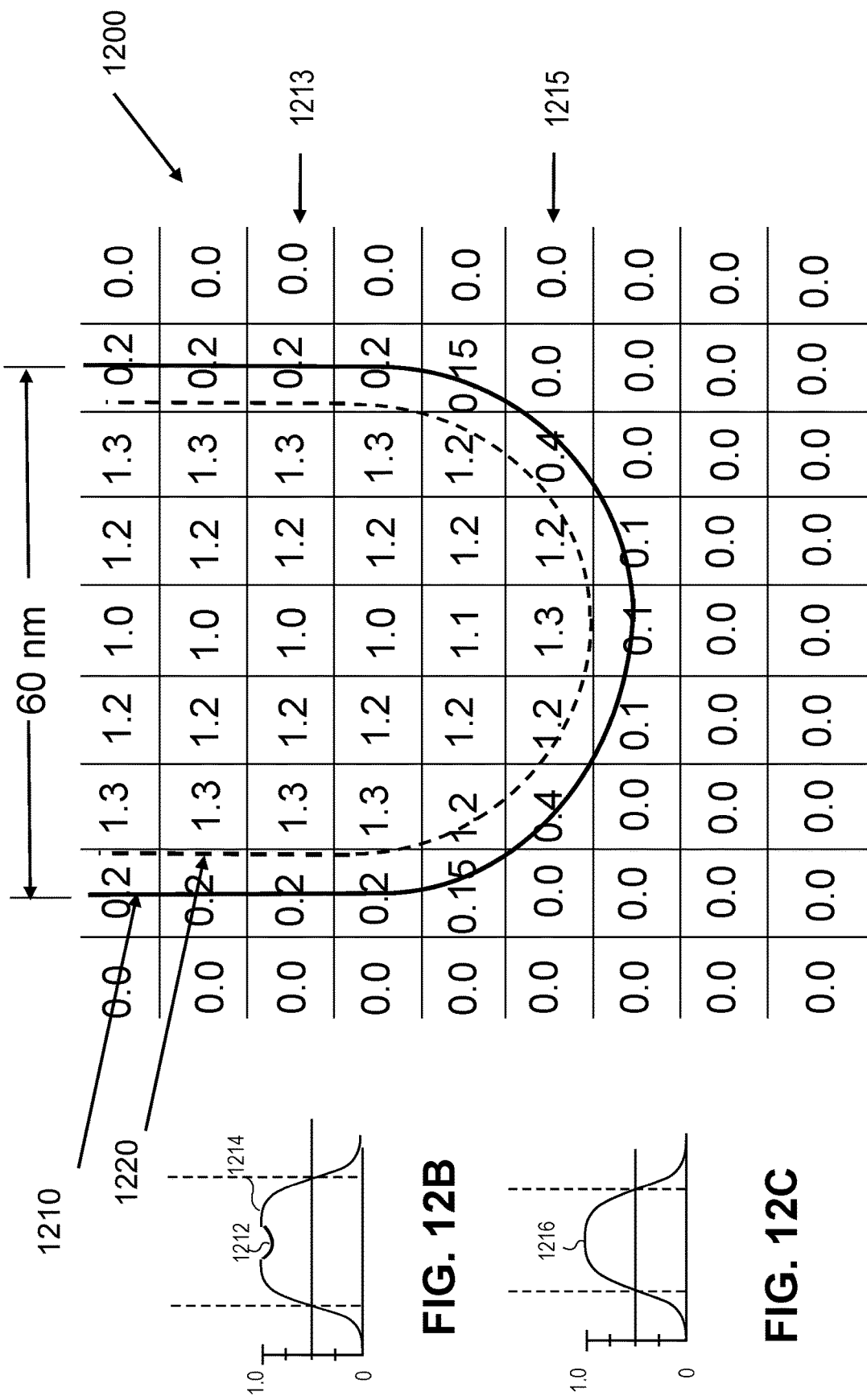
FIGS. 12A-12C illustrate a dose map of a line end with linearity corrections, in accordance with some embodiments.

FIGS. 12A-13C illustrate how dose margin enhancement can be accomplished with pixel dosage array shape data. As is known to those skilled in the art, in a leading edge mask process in semiconductor device manufacturing, for example, when shapes smaller than approximately 100 nm in mask dimensions are exposed with a normal 1.0 dose shot, the edge will have a dose margin that is worse than for larger shots. FIG. 12A illustrates a pixel array 1200 in which pixel doses reflect linearity corrections, performed to improve dose margin, for a narrow line end having a width of 60 nm. In some embodiments, dose is increased near an edge, such as within 3 pixels from the edge of the pattern or desired shape, compared to the interior of the pattern, for improved dose margin where the pattern or portions of the pattern exceeds a pre-determined width. For patterns or portions of patterns below the pre-determined width the dose is increased near the center of the pattern because the center is near the edge. In some embodiments the increased dose is a pre-PEC maximum dose. In this example, the pixel size is 10 nm in both X and Y directions and the pre-determined width is 40 nm. The pre-PEC maximum dose, calculated from a target post-PEC maximum dose, is shown in FIG. 12A as 1.3 in this example. A calculated edge 1210 is determined from this data, representing a line end pattern. FIG. 12B, a cross section of the pattern's dose profile where the pattern width exceeds the pre-determined width along the row 1213 of pixel array 1200 in FIG. 12A, indicates a higher dose near the edge 1214 than near the center 1212. FIG. 12C, a cross section of the pattern's dose profile where the pattern width is below the pre-determined width along the row 1215 of pixel array 1200, indicates the higher dose near the center of the pattern 1216 because the center is near the edge for patterns below the pre-determined width. The higher dose near the edge represents the pre-PEC maximum dose. Truncating any dose over 1.0 here would result in a smaller shape indicated by 1220 with worse dose margin.

Figures 13A, 13B, 13C:
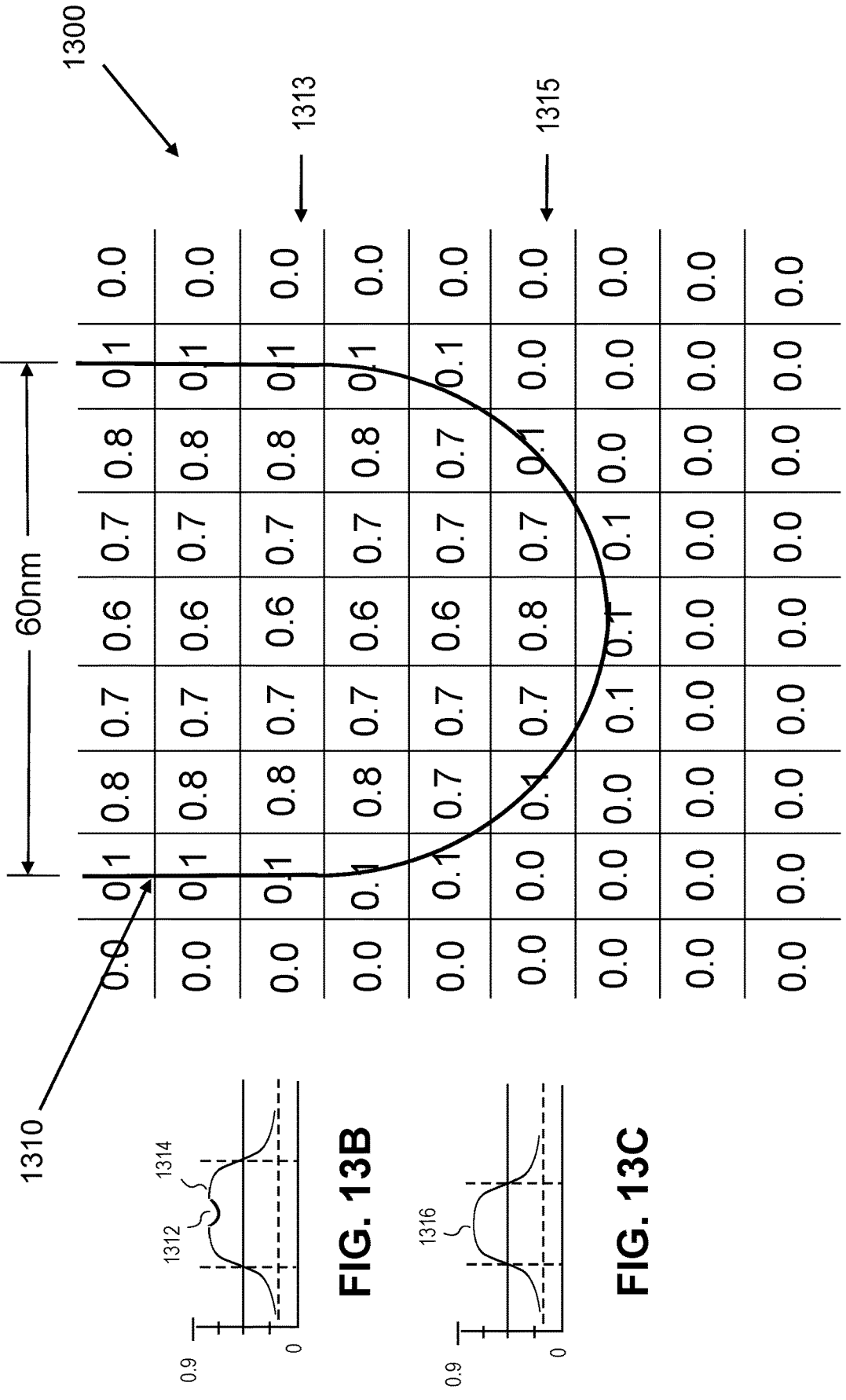
FIGS. 13A-13C illustrate a dose map of a line end with post-PEC max dose, in accordance with some embodiments.

FIG. 13A depicts calculated post-PEC exposure information needed to maintain the pattern size while reducing write time and achieving an acceptable dose margin in accordance with some embodiments. In this example, for an embodiment using a target post-PEC maximum dose of 0.9, FIG. 13A illustrates post-PEC doses resulting from the modified exposure information, taking backscatter into account as illustrated in FIGS. 7A-7G. The dose margin in FIG. 12A is better than the dose margin in FIG. 13A; however, the dose margin in FIG. 12A may be much greater than needed compared to a pre-determined threshold dose margin. In FIG. 13A the dose margin is also better than the threshold dose margin, but the write time is shorter than in FIG. 12A since the doses are smaller. FIG. 13A shows a resulting pixel array 1300 which would achieve the size indicated by 1310 with pixel doses below the maximum dose and with sufficient dose margin.

In some embodiments, the post-PEC maximum dose is calculated near an edge, such as within 3 pixels of the edge of a pattern or desired shape. For patterns or portions of patterns that exceed a pre-determined width, the dose calculated near the edge is higher than the center. For patterns or portions of patterns that are below a pre-determined width, the dose calculated near the edge is near the center of the pattern. For example, FIG. 13B illustrates a dose profile for a cross section of pattern 1310 that is greater than the pre-determined width along row 1313 of pixel array 1300 in FIG. 13A. As shown in FIG. 13B, the dose at location 1312 near the center of the cross section is less than the dose at location 1314 near the edge. In some embodiments, the post-PEC maximum dose calculated near the edge is at the center of a pattern or desired shape. For example, FIG. 13C illustrates a dose profile for a cross section of 1310 that is less than the pre-determined width along row 1315 of pixel array 1300 in FIG. 13A. In FIG. 13C the post-PEC maximum dose near the edge is the center of the pattern 1316.

In embodiments, methods for exposing a desired shape in an area on a surface using a charged particle beam system include determining a local pattern density for the area, based on an original set of exposure information. A pre-proximity effect correction (PEC) maximum dose for the local pattern density is determined, based on a pre-determined target post-PEC maximum dose. The pre-PEC maximum dose is calculated near an edge of the desired shape. Methods also include modifying the original set of exposure information with the pre-PEC maximum dose to create a modified set of exposure information.

In some cases, the pre-determined target post-PEC maximum dose is based on a maximum write time. In some cases, the modified set of exposure information is refined by PEC resulting in adjusted dosages that are less than the pre-determined target post-PEC maximum dose. In some cases, a portion of a width of the desired shape exceeds a pre-determined width. In some cases, at a location where a width of a portion of the desired shape is below a pre-determined width, the pre-PEC maximum dose is calculated near a center of the desired shape.

In some cases, methods further comprise calculating a backscatter for a sub area of the area, based on the local pattern density for the area. Methods may yet further include increasing a dosage for at least one pixel in a plurality of pixels in the sub area, in a location where the backscatter of the sub area is below a pre-determined threshold, thereby increasing the backscatter of the sub area. In some cases, the dosage for the at least one pixel in the plurality of pixels in the sub area is increased so that the backscatter is increased to a pre-determined value. In some cases, the dosage for the at least one pixel in the plurality of pixels in the sub area is increased only if the at least one pixel is more than a pre-determined distance from the edge of the desired shape in the area on the surface. In some cases, the increased dosage of the at least one pixel in the plurality of pixels in the sub area is applied closer than a pre-determined distance from an inner edge of the desired shape in the area on the surface. In some cases, the increase in dosage comprises an artificial background dose. In some cases, the sub area is subdivided into partitions, wherein the artificial background dose is determined for each partition. In some cases, the artificial background dose for any location within an individual partition is interpolated across the partition. In some cases, the interpolation is based on the artificial background doses for adjacent partitions.

In some cases, the original set of exposure information comprises information for multiple exposure passes, and wherein the increasing of the backscatter of the sub area only occurs in one exposure pass of the multiple exposure passes. In some cases, a mask exposure is performed inline with one or more steps selected from the group consisting of determining the local pattern density, determining the pre-PEC maximum dose, determining an artificial background dose, and creating the modified set of exposure information. In some cases, methods further comprise inputting a target dose margin, wherein the target dose margin is used to set the pre-determined target post-PEC maximum dose. In some cases, methods further comprise calculating a dose margin for the desired shape to be exposed; and the methods may further include calculating a target minimum dose margin at a pre-determined edge location of a pre-determined pattern in a pre-determined backscatter area, wherein the pre-PEC maximum dose is determined to achieve the dose margin below the target minimum dose margin for the desired shape to be exposed. In some cases, methods further comprise exposing the surface with the modified set of exposure information.

Optimization techniques may be used to determine the lowest dosage that can be achieved in interior portions of the pattern, as is disclosed in U.S. Pat. No. 9,372,391, "Method and System for Forming Patterns Using Charged Particle Beam Lithography with Variable Pattern Dosage," which is owned by the assignee of the present application and is hereby incorporated by reference. In some embodiments, these optimization techniques will include calculating the resist response to the set of shots, such as with using particle beam simulation, so as to determine that the set of shots forms the desired pattern, according to a particular parameter, such as within a predetermined tolerance. Note that when creating shots for a charged particle beam writer which supports only unassigned dosage shots, gaps can be used in interior areas of the pattern to reduce area dosage. By simulating, particularly with the "corner cases" of the manufacturing tolerance, designs with lower doses or gaps can be pre-determined to shoot the desired shapes safely with reduced write time and improved edge slope. Similarly, overlapping shots may be used to increase area dosage. The use of overlapping shots is disclosed in U.S. Pat. No. 7,754,401, "Method for Manufacturing a Surface and Integrated Circuit Using Variable Shaped Beam Lithography," which is owned by the assignee of the present application and hereby incorporated by reference.

Figure 14:
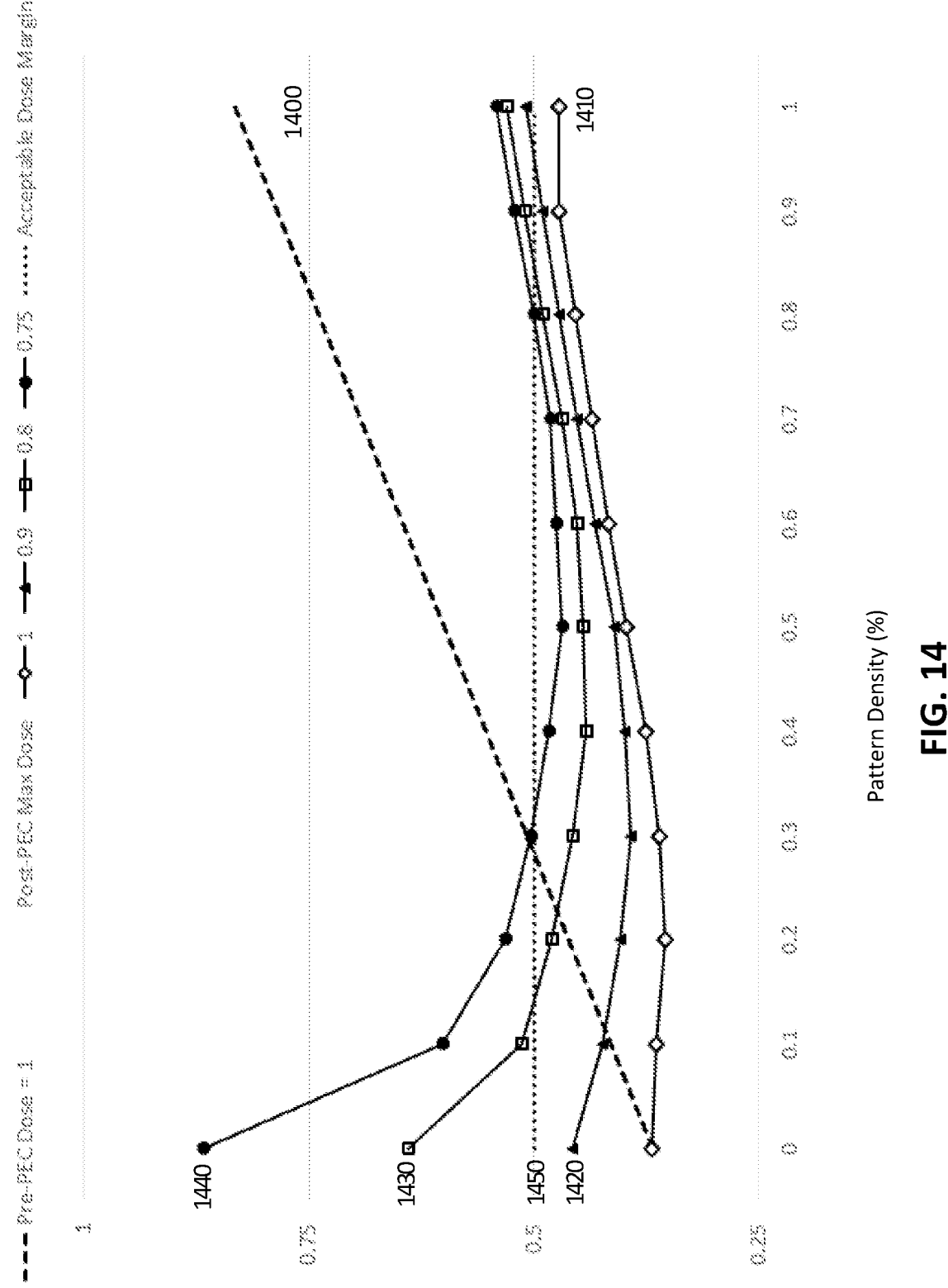
FIG. 14 illustrates dose margin at various post-PEC maximum doses by local pattern density, in accordance with some embodiments.

FIG. 14 illustrates a graph of dose margin versus pattern density for post-PEC maximum doses of 1, 0.9, 0.8 and 0.75. An acceptable dose margin of 0.5 in this embodiment is represented by dotted line 1450. The graph illustrates that post-PEC maximum doses at 1.0 (curve 1410) and 0.9 (curve 1420) for a given pattern density result in acceptable dose margins (i.e., below line 1450), even at higher pattern densities, versus pre-PEC normal dose 1.0 (line 1400) which exceeds the acceptable dose margin for pattern densities below about 0.3 (i.e., 30%). That is, at a normal dose shown by dashed line 1400, dose margin gets worse as pattern density increases. To address this issue of controlling dose margin, in some embodiments, a target dose margin is taken into account along with pattern density when choosing a target post-PEC maximum dose. For example, the range of post-PEC maximum doses shown in FIG. 14 illustrate that dose margin remains sufficient, below 0.5 as indicated along dotted line 1450, for all pattern densities with post-PEC maximum doses of 0.9 along line 1420 to 1.0 along line 1410. A 0.9 post-PEC maximum dose reduces write time by 10% compared to a 1.0 post-PEC maximum dose. At lower post-PEC maximum doses of 0.8 along line 1430 and 0.75 along line 1440, the dose margin for pattern densities below 30% become worse. Thus, a user may choose 0.9 as the target post-PEC maximum dose to limit the write time while also meeting the target dose margin.

Dynamic Maximum Dose with Artificial Background Dose

Figure 15:
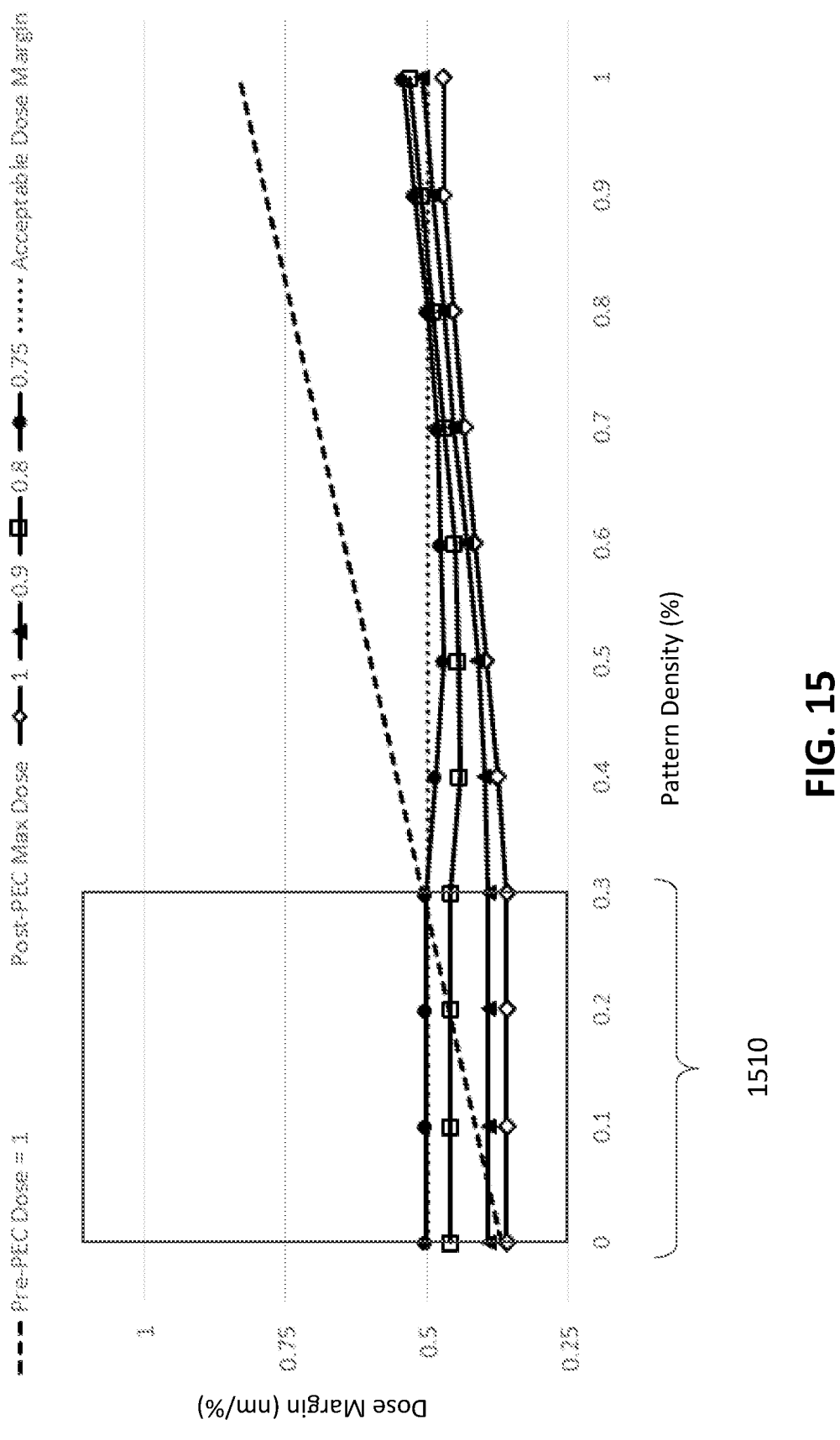
FIG. 15 illustrates dose margin for various post-PEC maximum doses by local pattern density with added artificial background dose, in accordance with some embodiments.

FIG. 15 is a graph of dose margin versus pattern density when an artificial background dose is added. By adding artificial background dose in areas 1510 where pattern densities are below a certain threshold, such as 30%, an acceptable dose margin can be achieved as shown in FIG. 15. That is, the dose margin is constant in area 1510 of FIG. 15, which is an improvement over the varying dose margins vs. pattern density in the same region of FIG. 14. In some embodiments artificial background dose is added to raise local pattern density up to a desired threshold, such as 30%, allowing a maximum dose reduction of up to 25% with sufficient dose margin. In addition, the pre-PEC maximum dose is calculated to enhance critical dimension uniformity (CDU) and line-edge roughness (LER) among other measures of resilience to manufacturing variation. Improving CDU and LER include enhancement of dose margin and improving the uniformity of dose margin across features in the mask. Enhancement of dose margin (edge slope) is disclosed in U.S. Pat. No. 8,473,875, "Method and System for Forming High Accuracy Patterns Using Charged Particle Beam Lithography", which is owned by the assignee of the present application and is hereby incorporated by reference.

In some embodiments a pre-determined artificial background dose, such as in the range of 20% to 30%, is defined and applied everywhere. A minimum target backscatter amount, or pre-determined amount, for example 30%, is defined. In some embodiments, where there is not naturally sufficient backscatter for PEC to decrease dose, surrounding dose is increased by adding artificial background dose to generate the minimum backscatter amount. In some embodiments, the artificial background dose comprises increasing dosage for a pixel in the plurality of pixels, the dosage being increased up to a pre-determined threshold. In some embodiments, the additional backscatter contributed by the artificial background dose is taken into account in the amount of artificial background dose to add by pre-computing the additional backscatter as contributed by the artificial background dose. The embodiments described herein are examples, and other variations of adding artificial background dose are possible. In some embodiments, the minimum backscatter amount will have built-in margin to account for the additional backscatter emanating from the artificial background dose. Since backscatter amounts are mathematically linear in behavior, the amount of backscatter added by the artificial background dose can be computed independently of the doses of the shots in any given region. In some embodiments that involve an increase in dosage for at one pixel in a plurality of pixels in the sub area where the backscatter of the sub area is below a pre-determined threshold, the increase in dosage comprises an artificial background dose. In embodiments, the total mask area will be subdivided into partitions of some size or sizes, and the artificial background dose is determined for each partition, with each of the partitions having one artificial background dose amount within the partition, but different partitions having potentially different artificial background dose amounts. Typically, PEC is computed on a coarse grid, such as a 50 nm grid, or 300 nm grid. For each grid or partition, the PEC adjustment is computed. In some implementations, the PEC adjustment for any location within a partition is interpolated based on the computed PEC adjustments for adjacent partitions. In some embodiments, the computing of the artificial background dose amount is done on the same grid as the grid used for PEC. In such an implementation, the received backscatter amount in each PEC grid is compared to the specified minimum target backscatter amount to determine the artificial background dose amount to provide for the area that the PEC grid covers. In some embodiments the artificial background dose for any location within an individual partition is interpolated across the partition, such as the interpolation being based on the artificial background doses for adjacent partitions. The ensuing PEC step will decrease the dose of the shot/pixel in question, decreasing the write time for that shot/pixel. Doing this for all shots/ pixels on the mask or a section of the mask decreases the dose and hence the write time for that section of the mask. The ensuing PEC step accounts for the addition of the artificial background dose and any additional backscatter contributed by artificial background dose. PEC adjusts the shot dose of all shots on the mask to adjust all CDs to hit the target in exactly the same way PEC has always worked for natural backscatter. Dose margins of adjusted shots are worse than prior to the addition of the artificial background dose. But the user adjusted parameter for minimum backscatter allows the dose margins to stay within acceptable dose margins as determined for a particular mask process.

With conventional VSB machines, casting a dose of any kind (however small in dose) requires a separate shot and blanking time separating the shots. Since blanking time is typically about the same amount of time as the exposure time at normal dose, at normal dose, a reasonable first-order approximation of a shot time might be considered to take 2 time units. In this approximation, a shot of 10% dose would take 1.1 time units. Since write time is of principal importance in optimizing both cost and yield of masks, and since complex leading edge masks are already seen to be taking too long to write, it is not commercially feasible to add artificial background dose everywhere there were otherwise no shots. Nevertheless, since the mask stage, which is typically variable speed, is heavy in a VSB mask writer, the mask stage can only change speeds gradually, therefore reducing peak dose density can help reduce write time for VSB machines.

Particularly for VSB machines, some embodiments of the present disclosure include purposefully leaking some eBeam energy, producing artificial background dose, during blanking time. The exact location of where the leaked eBeam is cast need not be precisely controlled. Since backscatter is a large-scale effect in the 10 μm radius range, nm-level control of location is not important. The amount of leakage and the period of leakage during the blanking time can be precisely calculated. Such calculation can compute the path that the eBeam is travelling and avoid casting the leakage close to (i.e., within the combined forward blur of) any pattern edge that needs precise control.

Surface writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process. In some embodiments, in VSB and multi-pass writing, only one or some of the writing passes cast the artificial background dose. In other words, in some embodiments the original set of exposure information comprises information for multiple exposure passes, and wherein the increasing of the calculated backscatter of the sub area only occurs in one exposure pass of the multiple exposure passes. Since precision is not important for artificial background dose, this is sufficient, and it saves writing time by not affecting all passes. The other passes have reduced peak dose of a pixel or a reduced peak dose density of an area without the additional write time required for the artificial background dose, such as in the embodiment depicted in FIG. 10A.

In some embodiments, a relatively isolated shape is purposefully surrounded by artificial background dose resulting in increased backscatter. PEC, the correction for backscatter, is accomplished by reducing the pixel or shot dosage-less reduction where the exposure density is low, and more reduction where the exposure density is high. However, reducing dose worsens dose margin.

An acceptable dose margin can be determined by the amount of size variation caused by the reduction in dose. In one embodiment an isolated pattern exposed with normal dose can be shot using a larger pattern and a reduced dose to an acceptable level without adding artificial background dose.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. Too much variation, particularly for the minimum sized features, may result in that shape not being printed at all, causing the resulting circuit to malfunction. Manufacturing variations, such as line-edge roughness and corner rounding, will also be present in the actual patterns on a surface. In addition, more size variation translates to more variation in circuit performance, leading to higher design margins being required, making it increasingly difficult to design faster, lower-power integrated circuits. This variation is referred to as critical dimension (CD) variation. A low CD variation, in particular a uniformly low CD variation across all shapes across the mask, is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is inversely related to the slope of the dosage curve at the resist threshold, which is called edge slope. Therefore, edge slope and its inverse, dose margin, is a critical optimization factor for particle beam writing of surfaces. In this disclosure, edge slope and dose margin are terms that are used interchangeably.

In some embodiments, methods include suggesting an appropriate amount of artificial background dose through the use of an edge slope that meets a target level; that is, an edge slope that is "good enough." Since resilience to manufacturing variation is a statistical notion, the sense of a "good enough" edge slope is not an exact expression of a strict inequality.

In some embodiments of the present methods, the amount of artificial background dose is determined in which the edge slopes are above a "good enough" level. For example, a particular mask manufacturing process may be tuned to produce reliable manufacturing results for 100 nm×2 μm lines being written in a 75% exposure density area, producing a larger amount of backscatter, therefore having the least amount of shot/pixel dose post-PEC, and therefore having a relatively shallow edge slope. In some embodiments, the edge slope of that line post-PEC is designated as "good enough." While there will be other shapes, such as a 40 nm×200 nm space being written in a 75% density area, where edge slope is worse, the mask manufacturing process may determine that the edge slope there is not "good enough" but is still manufacturable in the overall tradeoff of economics, time, and manufacturing reliability. The function of the "good enough" edge slope for the present embodiments is to designate that being even better than "good enough" is taking too much time to cast that dose as compared to the incremental benefit of resilience to manufacturing variation. Decreasing edge slope to a less than optimal level—that is, below a target level—is counterintuitive since the conventional teaching is to maximize edge slope.

In some embodiments, the pre-PEC maximum dose and the artificial background dose amounts are computed automatically. In one embodiment, pre-PEC maximum dose and artificial background dose can be computed to achieve an acceptable level of contrast (a reduction in contrast). In another embodiment, pre-PEC maximum dose and artificial background dose can be computed to achieve a dose margin below a target minimum dose margin. The minimum acceptable dose margin can be determined by calculating a dose margin at a pre-determined edge location of a pre-determined pattern in a pre-determined backscatter area.

In some embodiments, artificial background dose is added before PEC to reduce write time, by decreasing dosage during PEC where the edge slope with the decreased dosage may be below a target level. In some embodiments, a target or "good enough" level may be calculated by simulating the edge slope of a feature that is known in the manufacturing process to be working sufficiently well to be used for production purposes. For example, for leading edge photomask manufacturing, a repeating pattern of 100 nm wide wires separated by 100 nm wide spaces is made to be stable, when exposed with a normal dose before PEC. A simulation of the edge slope for a 100 nm wide line in the context of a 100 nm line and space pattern may be considered a dose margin that is "good enough." For purposes of calculating artificial background dose, a 100 nm line-and-space pattern has a 50% exposure density in the surrounding area. A natural backscatter resulting from the 50% exposure density is calculated as a minimum backscatter amount. The sum of natural backscatter already present in an area plus an amount of additional backscatter generated by artificial background dose that is evenly distributed so as to contribute an overall background exposure up to the minimum backscatter that is uniform throughout the mask. Although a 50% exposure density may not produce the worst acceptable dose margin post-PEC, it may be declared as a good practical target to achieve for the purposes of computing the amount of minimum acceptable dose from which artificial background dose amount is computed.

Figure 16:
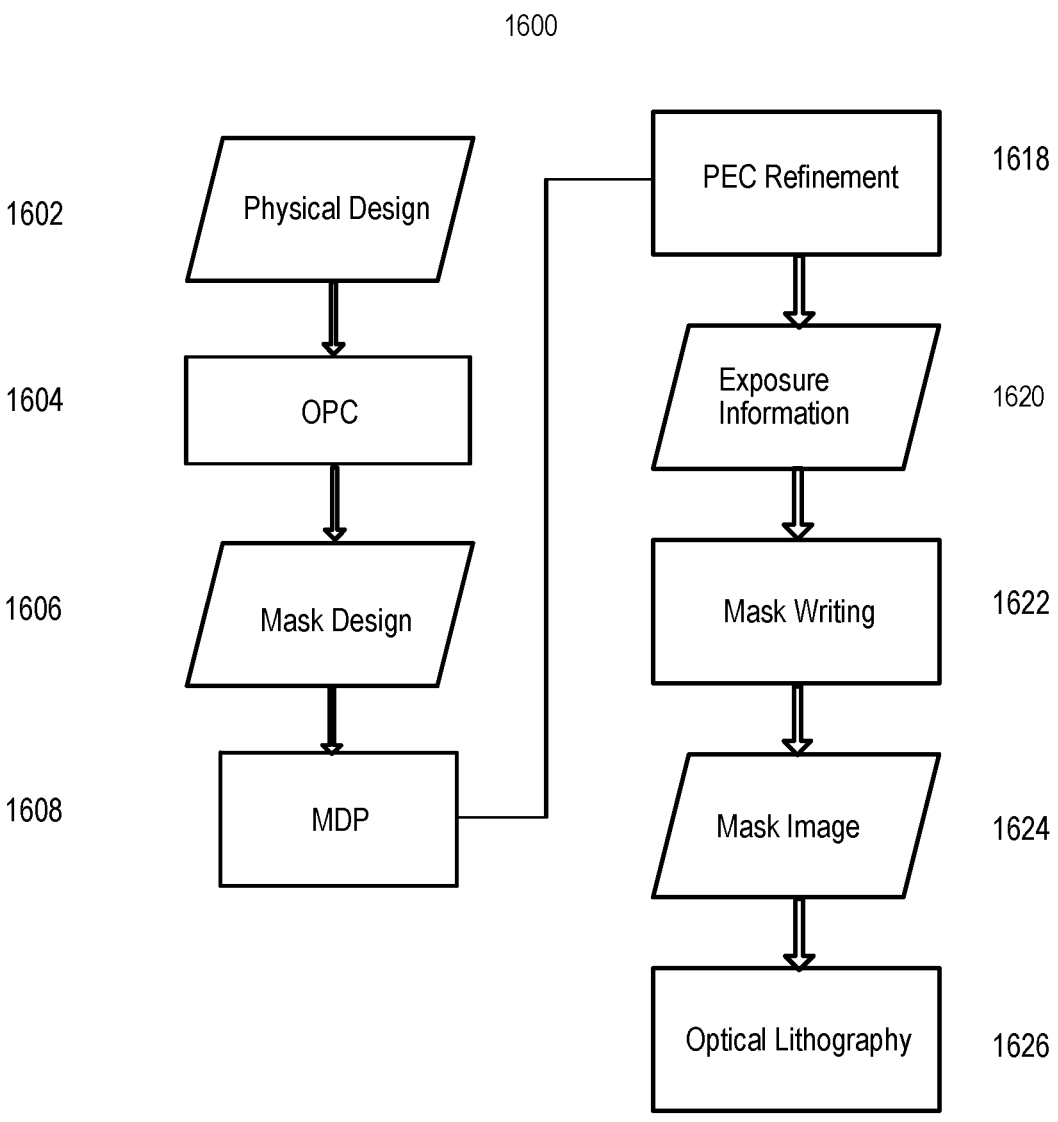
FIG. 16 illustrates a conceptual flow diagram for preparing a surface or reticle for use in fabricating a substrate such as an integrated circuit on a silicon wafer, as known in the art.

FIG. 16 is a conceptual flow diagram 1600 for preparing a surface such as a reticle or other surface, using charged particle beam lithography, as known in the art. In a first step 1602, a physical design, such as a physical design of an integrated circuit, is created. This can include determining the logic gates, transistors, metal layers, and other items that are required to be found in a physical design such as the physical design of an integrated circuit. Next, in a step 1604, optical proximity correction (OPC) is determined for the physical design of step 1602 or on a portion of the physical design desired on the wafer to create a mask design 1606. OPC computes the mask shapes needed to best produce the desired wafer shapes across manufacturing variation. OPC alters the physical design to compensate for distortions caused by effects such as optical diffraction and the optical interaction of features with proximate features producing the mask design 1106.

Mask process correction (MPC) may optionally be performed on the mask, design 1606. MPC modifies the pattern to be written to the reticle so as to compensate for non-linear effects, such as effects associated with patterns smaller than about 100 nm in conventional optical lithographic masks. MPC may also be used to compensate for non-linear effects affecting EUV masks. In some embodiments of the present invention, MPC may be performed as part of a fracturing or other mask data preparation (MDP) operation.

In a step 1608, a mask data preparation (MDP) operation which may include a fracturing operation, a shot placement operation, a dose assignment operation, or a shot sequence optimization. In some embodiments that are for multi-beam mask writing, MDP step 1608 may include generating a plurality of multi-beam shots, each multi-beam shot comprising one or more beamlets, where dosage areas are determined and dosages assigned to beamlets in each dosage area. In some embodiments, beamlet dosages may vary within a dosage area.

A proximity effect correction (PEC) refinement is performed in step 1618, in which dosages are adjusted to account for backscatter, fogging, and loading effects, creating an exposure information in step 1620 with adjusted dosages. The adjusted dosages in exposure information of step 1620 are used to generate a surface in a mask writing step 1622, which uses a charged particle beam writer such as an electron beam writer system. Depending on the type of charged particle beam writer being used, the PEC refinement 1618 may be performed by the charged particle beam writer. Mask writing step 1622 may comprise a single exposure pass or multiple exposure passes. The electron beam writer system projects a beam of electrons through a stencil or aperture plate onto a surface to form a mask image 1624 comprising patterns on the surface. The completed surface, such as a reticle, may then be used in an optical lithography machine, which is shown in a step 1626.

Figure 17:
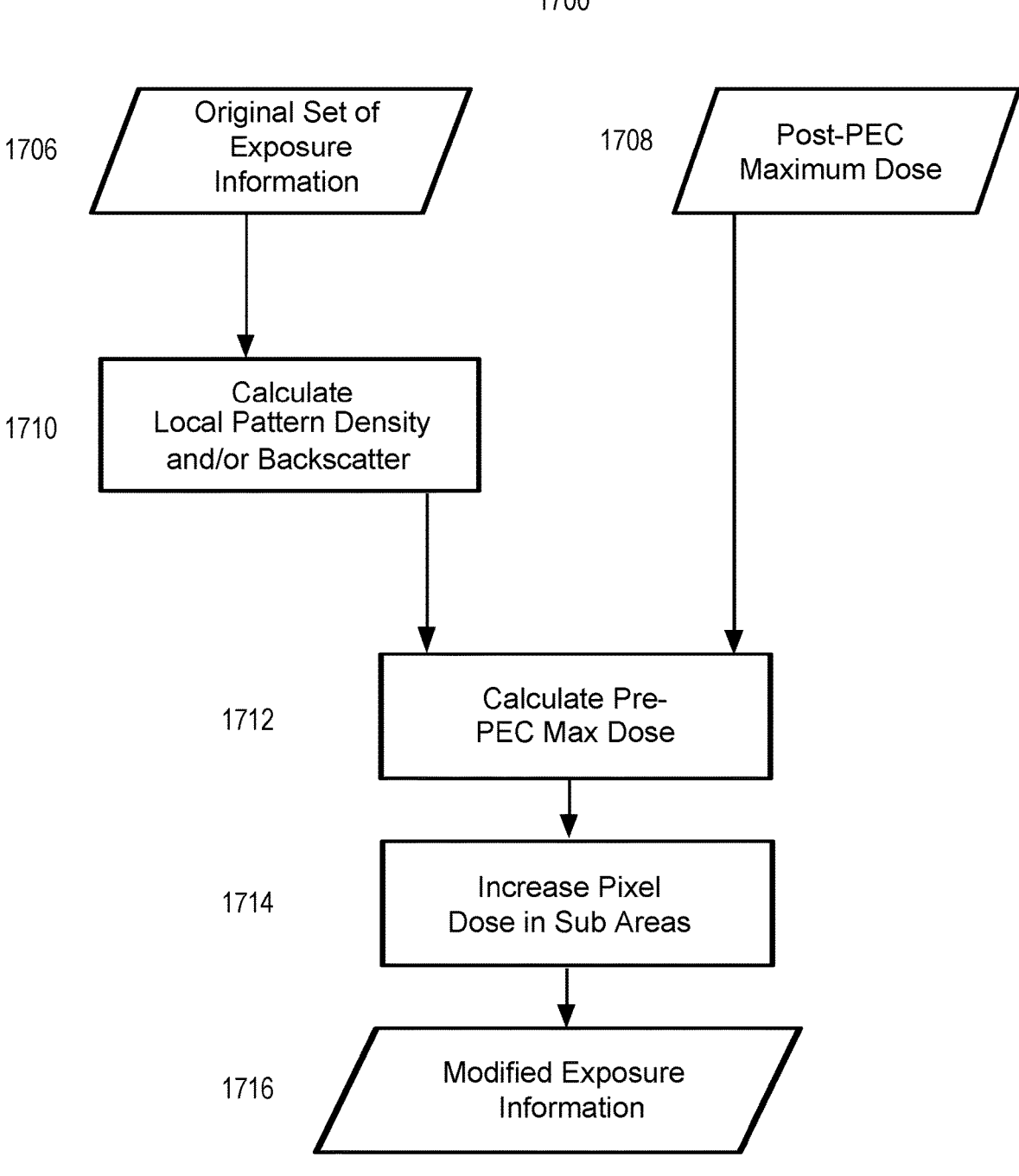
FIG. 17 illustrates a flow in which dynamic maximum dose and artificial background dose is calculated, in accordance with some embodiments.

FIG. 17 illustrates a flow 1700 representing a method for exposing a pattern, or desired shape in an area on a surface, in which dynamic maximum dose and artificial background dose are calculated and may be applied, in accordance with some embodiments. In step 1706 an original set of exposure information for the desired shape is input. In some embodiments, the original set of exposure information is a collection of pixels and their dosages. In another embodiment, the original set of exposure information is a set of shapes potentially including curvilinear or entirely non-polygonal descriptions (like circles or splines). In yet another embodiment the original set of exposure information is a set of shots with pre-PEC dose assigned or implied (e.g., VSB) or a set of shapes with pre-PEC dose assigned or implied (e.g., multi-beam writing). In general, the input in step 1706 is anything that describes shapes or pixels.

A post-PEC maximum dose is input in step 1708, which serves as a target or desired maximum dose after PEC. In some embodiments, step 1708 involves inputting a target post-proximity effect correction maximum dose, wherein the target post-PEC maximum dose is based on a maximum write time. In some embodiments, a threshold for artificial background dose is also input. In other embodiments a target dose margin is input and used to set the value of the pre-determined target post-PEC maximum dose. That is, the target dose margin may be used as a factor in choosing the post-PEC maximum dose, such as to achieve a dose margin below the target dose margin. In such embodiments, flow 1700 may include a step of calculating a dose margin for the pattern to be exposed, such as calculating a target minimum dose margin at a pre-determined edge location of a pre-determined pattern in a pre-determined backscatter area, where the pre-PEC maximum dose is determined to achieve the dose margin of the pattern to be exposed below the target minimum dose margin. The post-PEC maximum dose, artificial background dose threshold and/or the target dose margin may be input, for example, by a user. In yet another embodiment the post-PEC maximum dose may be chosen based on a desired write time, such as to reduce write time by a certain amount compared to normal dosage, or to stay below a threshold as limited by a maximum machine write time. In another embodiment the post-PEC maximum dose may be based on a feature size, such as the smallest feature. In another embodiment the post-PEC maximum dose may be based on other measures of printability or by some other method.

A local pattern density, and/or backscatter is determined (i.e., calculated) in step 1710, based on the original set of exposure information. In one embodiment, the calculation of local pattern density in step 1710 includes an initial determination for PEC which creates an initial map of backscatter. PEC is an iterative process where dose is adjusted to print the desired size in the presence of backscatter. The initial map of backscatter from the initial PEC determination is a good relative indication of higher and lower dose density areas. In some embodiments backscatter is calculated for a sub area of an area to be exposed, based on the original set of exposure information. In some embodiments, locations where the backscatter of sub areas are below a pre-determined threshold are identified in step 1710.

A pre-PEC maximum dose for the local pattern density is determined (i.e., calculated) dynamically in step 1712, based on the target post-PEC maximum dose of step 1708. That is, the pre-PEC maximum dose is dynamic in that it may change according to the particular set of exposure information (local pattern density), target dose margin, desired maximum write time, and/or other target parameters. In some embodiments the pre-PEC maximum dose is pre-calculated for various area pattern densities and the pre-PEC maximum dose is supplied for the local pattern density, accordingly. In some embodiments the pre-PEC maximum dose, calculated for the local pattern density, is input to a linearity correction algorithm.

In some embodiments, calculations include determining an artificial background dose for the area in step 1714, where the artificial background dose comprises additional exposure information, or an increase in dosage. In some embodiments, step 1714 is performed in a sub area with a local pattern density where backscatter below the pre-determined threshold was identified in step 1710. In some embodiments, dosage is increased for a plurality of pixels in the sub area, wherein the artificial background dose is achieved by applying the increase in dosage. That is, dosage is increased for at least one pixel in a plurality of pixels in the sub area, in a location where the backscatter of the sub area is below a pre-determined threshold, thereby increasing the backscatter of the sub area. In some embodiments, flow 1700 includes calculating a backscatter for the area based on the original set of exposure information, and step 1714 adds the artificial background dose only where the calculated backscatter is less than (i.e., below) the pre-determined threshold, that is the artificial background dose increases the backscatter an amount that is the difference between the pre-determined threshold and the calculated backscatter. In some embodiments, pixel dosage is increased if the pixel dosage is below the pre-determined threshold. In some embodiments, in step 1714 the dose margin or edge slope is calculated for a desired shape in the area and the artificial background dose is determined to maintain "good enough" edge slope or contrast for the desired shape in the area. In some embodiments, step 1714 adds the artificial background dose to maintain "good enough" edge slope for the desired shape in the area that meets a certain criteria, such as minimum subject size for a "good enough" edge slope. For example, smaller size shapes for SRAFs may be exempt from the "good enough" edge slope. As another example, smaller size shapes for SRAFs may have a different "good enough" edge slope to fulfill in determining the artificial background dose to be added. In some embodiments, these calculations can result in a creation of an artificial background dose comprising additional pixel dose with sub-threshold exposure such that the additional pixel dose will not print. The additional pixel dose is combined with the modified set of exposure information. In some embodiments, the artificial background dose is applied only beyond a pre-determined distance from an edge of the pattern on the surface. For example, in some embodiments, the dosage for the at least one pixel in the plurality of pixels in the sub area is increased only if the at least one pixel is more than a pre-determined distance from an edge of the desired shape in the area on the surface. In some embodiments, the original set of exposure information comprises information for multiple exposure passes, and the artificial background dose is only added in an exposure pass.

In step 1716, the original exposure information is modified to include the pre-PEC maximum dose of step 1712 and to include an increased dosage of at least one pixel in the sub area or artificial background dose of step 1714 to create a modified set of exposure information. In some embodiments, the modified set of exposure information is refined by PEC resulting in adjusted dosages that are less than (i.e., does not exceed) the post-PEC maximum dose of step 1708. In some embodiments, the flow 1700 may also include exposing the surface with the modified set of exposure information.

In some embodiments, the calculation of pre-PEC maximum dose and the addition of artificial background dose occur as part of an MDP step (e.g., step 1608 of flow 1600, FIG. 16), where the additional patterns geometrically overlap the desired pattern in the mask design (e.g., step 1606 of flow 1600. FIG. 16). Artificial background dose overlapping the desired shape near an inner edge may be modified by a mask process correction (MPC) step (e.g., as part of an MDP step 1608). A modified set of exposure information in step 1716 containing the original set of exposure information which may be adjusted with the pre-PEC maximum dose, or combined with the additional exposure information (i.e., additional pixel dose) may be read by a proximity effect correction (PEC) refinement step (e.g., step 1618 of flow 1600, FIG. 16), producing modified exposure information in step 1716 that includes the artificial background dose and may also include a backscatter arising from artificial background dose. In some embodiments, the modified set of exposure information reduces overall write time compared to the original set of exposure information. In some embodiments, the modified set of exposure information is refined by PEC resulting in adjusted dosages of the modified set of exposure information. The exposure information is then used to expose a surface with the modified set of exposure information. In some embodiments, pixel or shot dose is modified to add the artificial background dose. In some embodiments, pixels or shots cast artificial background dose in otherwise empty areas (pixels that start out at zero dose) with the amount of dose relatively similar for pixels, for example in a 3×3 or greater number of adjacent pixels. Pixel dose modification and edge location techniques, as is disclosed in U.S. Pat. No. 10,444,629, "Bias Correction for Lithography," which is owned by the assignee of the present application, may be used to determine where to apply artificial background dose. Steps would include inputting an array of pixels, identifying an edge of the desired shape in the area and determining a distance from the edge to apply artificial background dose.

Figure 19:
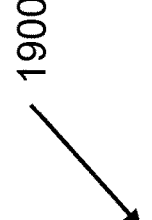
FIG. 19 illustrates an example portion of a dose map with artificial background dose, in accordance with some embodiments.

FIG. 19 illustrates an example portion of a dose map 1900 with artificial background dose of 0.3 applied in the bottom and left pixels of the dose map 1900, 3 sigma or 4 or more pixels away from the edge of a desired shape located in the upper right of the dose map. In FIG. 19, the pixels where the artificial background dose is applied were a dose of 0.0 in the original set of exposure information, and have been increased, using pixel dose modification and edge location techniques described herein, in the sub-area to the dose of 0.3. In this example, pixels with dose 0.3 lie within a portion of the sub area. Note that the artificial background dose of 0.3 is used as an example for this embodiment; other values may be used in other embodiments. Artificial background dose added by pixel dose modification is beneficial in that no particular features or patterns may be required, thus avoiding offline geometry preparation and rasterization. In some embodiments, a pixel in the plurality of pixels is individually evaluated for an appropriate amount of dose increase. In some embodiments, the dosage for the at least one pixel in the plurality of pixels in the sub area is increased so that the calculated backscatter is increased to a pre-determined value. The pre-determined value may be set based on a local pattern density, for example. In some embodiments, pixel dosage is increased only if the pixel (i.e., at least one pixel in the plurality of pixels in the sub area) is more than a pre-determined distance from an edge of the pattern on the surface.

In some embodiments, some or all of steps 1710, 1712, 1714 and 1716 of FIG. 17 followed by steps 1618 and 1620 of FIG. 16 are performed simultaneously with mask writing step 1622 of flow 1600, FIG. 16, with inline processing to perform data manipulation while the mask is being exposed. That is, in some embodiments the mask exposure is performed inline with one or more steps selected from the group consisting of determining (i.e., calculating) the local (i.e., area) pattern density, determining a pre-PEC maximum dose for the area, calculating the backscatter for a sub area of the area, determining a location in the sub area where the calculated backscatter is below a pre-determined threshold, determining the artificial background dose and increasing a dosage for at least one pixel in a plurality of pixels in the location in the sub area, and creating the modified set of exposure information. In other embodiments, calculations may be performed during the exposure of another surface, in a pipelined fashion. In a pipelined system, the next surface to be written on the machine is calculated while the previous surface is being written on the machine. A pipelined system is effective for improving the throughput of many surfaces, if the surfaces have similar write times and compute times. An inline (real time) system is effective for improving the throughput as well as the turnaround times of each surface.

The present methods can be used offline, pipelined or inline. Being fast enough to be able to process inline is most desirable. Inline processing is most desirable particularly when the number of total pixels that needs to be written is very large. For example, for semiconductor device manufacturing for multi-beam eBeam writing of masks, over 500 T-Bytes of data are required to store all the pixel data. Since multi-beam eBeam machines need to write the pixels extremely quickly, storing such data on hard disk or even solid-state disk may not be practical in cost. In inline processing, unlike in offline or pipelined processing, there is no need to store the data because the machine consumes the data to write the pixels soon after the data is computed. This is another reason why inline processing that the present methods enable is valuable. As mentioned above, the same methodology can be used for adjusting pixel doses to improve dose margin (i.e., edge slope).

The mask data preparation, calculation of maximum dose, calculation of artificial background dose and proximity effect correction described in this disclosure may be implemented using general-purpose computers using Central Processing Units (CPU) with appropriate computer software as computation devices. Due to the large amount of calculations required, multiple computers or processor cores of a CPU may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. Specialty computing hardware devices or processors may include, for example, field-programmable gate arrays (FPGA), application-specific integrated circuits (ASIC), or digital signal processor (DSP) chips. In one embodiment, the special-purpose hardware device may be a graphics processing unit (GPU). In another embodiment, the optimization and calculation processes described in this disclosure may include iterative processes of revising and recalculating possible solutions, so as to minimize the total charged particle beam writing time, or some other parameter. In yet another embodiment, the processes may be deterministic computations without iteration.

Figure 18:
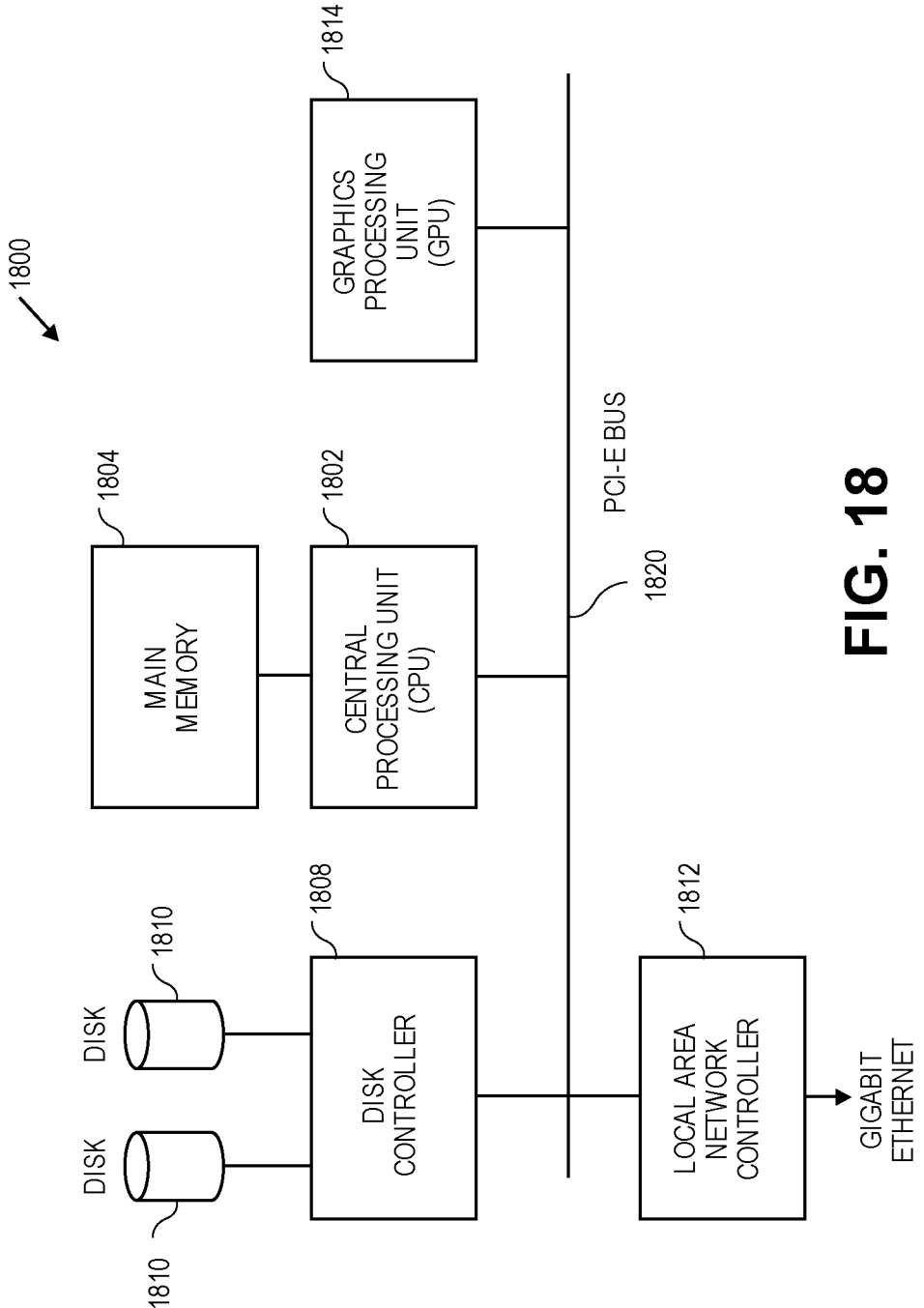
FIG. 18 illustrates an example computing hardware device used in embodiments of the methods.

FIG. 18 illustrates an example of a computing hardware device 1800 that may be used to perform the calculations described in this disclosure. Computing hardware device 1800 comprises a central processing unit (CPU) 1802, with attached main memory 1804. The CPU may comprise, for example, eight processing cores, thereby enhancing performance of any parts of the computer software that are multi-threaded. The size of main memory 1804 may be, for example, 64 G-bytes. The CPU 1802 is connected to a Peripheral Component Interconnect Express (PCIe) bus 1820. A graphics processing unit (GPU) 1814 is also connected to the PCIe bus. In computing hardware device 1800 the GPU 1814 may or may not be connected to a graphics output device such as a video monitor. If not connected to a graphics output device, GPU 1814 may be used purely as a high-speed parallel computation engine. The computing software may obtain significantly higher performance by using the GPU for a portion of the calculations, compared to using CPU 1802 for all the calculations. The CPU 1802 communicates with the GPU 1814 via PCIe bus 1820. In other embodiments (not illustrated) GPU 1814 may be integrated with CPU 1802, rather than being connected to PCIe bus 1820. Disk controller 1808 may also be attached to the PCIe bus, with, for example, two disks 1810 connected to disk controller 1808. Finally, a local area network (LAN) controller 1812 may also be attached to the PCIe bus, and provides Gigabit Ethernet (GbE) connectivity to other computers. In some embodiments, the computer software and/or the design data are stored on disks 1810. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for mask data preparation, and proximity effect correction may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

The invention claimed is:

1. A method for exposing a desired shape in an area on a surface using a charged particle beam system, the method comprising:

determining a local pattern density for the area, based on an original set of exposure information;

determining a pre-proximity effect correction (PEC) maximum dose for the local pattern density, based on a pre-determined target post-PEC maximum dose, wherein the pre-PEC maximum dose is calculated near an edge of the desired shape; and modifying the original set of exposure information with the pre-PEC maximum dose to create a modified set of exposure information;

wherein the pre-determined target post-PEC maximum dose is based on a maximum write time.

2. The method of claim 1, wherein the modified set of exposure information is refined by PEC resulting in adjusted dosages that are less than the pre-determined target post-PEC maximum dose.

3. The method of claim 1, wherein a portion of a width of the desired shape exceeds a pre-determined width.

4. The method of claim 1, wherein at a location where a width of a portion of the desired shape is below a pre-determined width, the pre-PEC maximum dose is calculated near a center of the desired shape.

5. The method of claim 1, further comprising calculating a backscatter for a sub area of the area, based on the local pattern density for the area.

6. The method of claim 5, further comprising increasing a dosage for at least one pixel in a plurality of pixels in the sub area, in a location where the backscatter of the sub area is below a pre-determined threshold, thereby increasing the backscatter of the sub area.

7. The method of claim 6, wherein the dosage for the at least one pixel in the plurality of pixels in the sub area is increased so that the backscatter is increased to a pre-determined value.

8. The method of claim 6, wherein the dosage for the at least one pixel in the plurality of pixels in the sub area is increased only if the at least one pixel is more than a pre-determined distance from the edge of the desired shape in the area on the surface.

9. The method of claim 6, wherein the increased dosage of the at least one pixel in the plurality of pixels in the sub area is applied closer than a pre-determined distance from an inner edge of the desired shape in the area on the surface.

10. The method of claim 6, wherein the increase in dosage comprises an artificial background dose.

11. The method of claim 6, wherein the original set of exposure information comprises information for multiple exposure passes, and wherein the increasing of the backscatter of the sub area only occurs in one exposure pass of the multiple exposure passes.

12. The method of claim 5, wherein the sub area is subdivided into partitions, wherein an artificial background dose is determined for each partition.

13. The method of claim 12, wherein the artificial background dose for any location within an individual partition is interpolated across the individual partition.

14. The method of claim 13, wherein the interpolation is based on the artificial background doses for adjacent partitions.

15. The method of claim 1, wherein a mask exposure is performed inline with one or more steps selected from the group consisting of determining the local pattern density, determining the pre-PEC maximum dose, determining an artificial background dose, and creating the modified set of exposure information.

16. The method of claim 1, further comprising inputting a target dose margin, wherein the target dose margin is used to set the pre-determined target post-PEC maximum dose.

17. The method of claim 1, further comprising calculating a dose margin for the desired shape to be exposed.

18. The method of claim 17, further comprising calculating a target minimum dose margin at a pre-determined edge location of a pre-determined pattern in a pre-determined backscatter area;

wherein the pre-PEC maximum dose is determined to achieve the dose margin below the target minimum dose margin for the desired shape to be exposed.

19. The method of claim 1, further comprising exposing the surface with the modified set of exposure information.

* * * * *